United States Patent [19]
Sugiyama et al.

[11] Patent Number: 5,365,391
[45] Date of Patent: Nov. 15, 1994

[54] MAGNETIC REPRODUCING HEAD HAVING A DISTRIBUTED-CONSTANT CIRCUIT TYPE MAGNETIC FIELD DETECTOR

[75] Inventors: Yasunari Sugiyama, Tokyo; Kiyoshi Kagawa, Kanagawa; Masatoshi Hayakawa, Miyagi; Hiroyuki Ohmori, Kanagawa, all of Japan

[73] Assignee: Sony Corporation, Tokyo, Japan

[21] Appl. No.: 842,924

[22] Filed: Feb. 27, 1992

[30] Foreign Application Priority Data

Feb. 28, 1991 [JP] Japan .................. 3-034795
Oct. 3, 1991 [JP] Japan .................. 3-256557

[51] Int. Cl.$^5$ ............... G11B 5/127; G01R 33/02
[52] U.S. Cl. ............... 360/110; 324/250; 324/260; 324/645
[58] Field of Search .............. 324/244, 248–250, 324/260, 645, 646; 360/110

[56] References Cited

U.S. PATENT DOCUMENTS

| | | | |
|---|---|---|---|
| 2,597,149 | 5/1952 | Kahan | 324/250 |
| 2,844,789 | 7/1958 | Allen | 324/250 |
| 2,972,105 | 2/1961 | Ghose | 324/250 |
| 4,906,607 | 3/1990 | Dev Tyagi | 324/250 X |
| 5,065,096 | 11/1991 | Muck et al. | 324/248 |

FOREIGN PATENT DOCUMENTS

0684467 9/1979 U.S.S.R. ................ 324/250

*Primary Examiner*—Gerard R. Strecker
*Attorney, Agent, or Firm*—Hill, Steadman & Simpson

[57] ABSTRACT

A distributed-constant circuit type magnetic field detector which includes a magnetic member whose permeability varies with changes in a magnetic field applied thereto disposed at a point where a magnetic field is produced in a distributed-constant circuit excited with an electromagnetic wave and a detector for detecting a change in electromagnetic field distribution in the distributed-constant circuit produced by a variation in permeability of the magnetic member upon application thereto of a magnetic field to be detected.

11 Claims, 25 Drawing Sheets

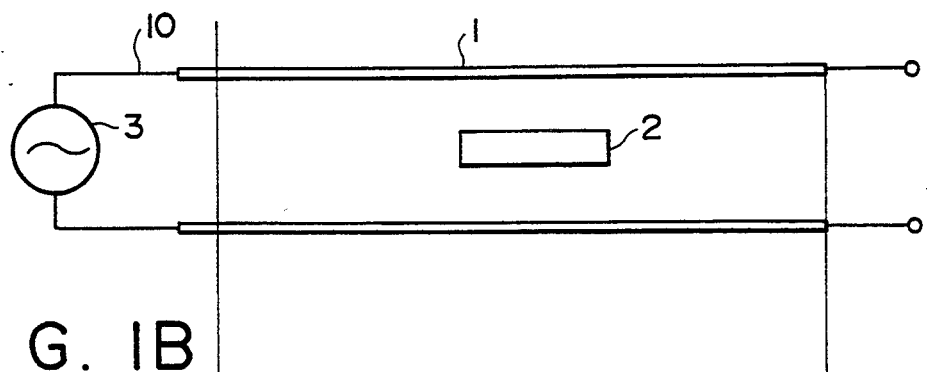
FIG. 1A
FIG. 1B
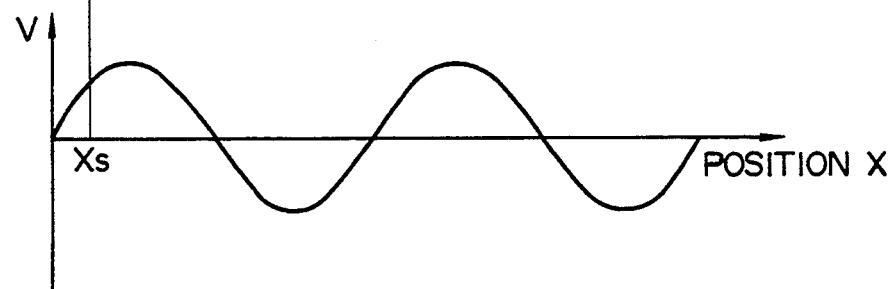
FIG. 2
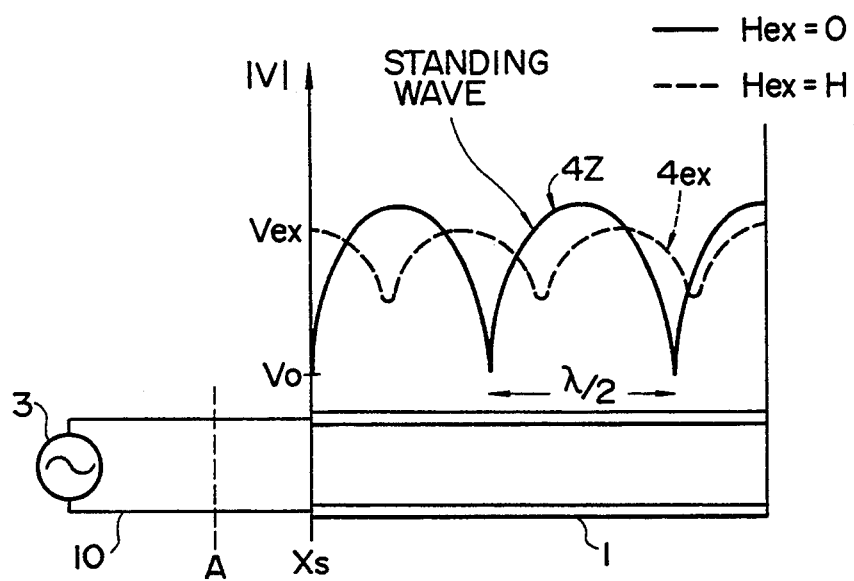

MARKER:
2 : 2 GHz
4 : 4 GHz
6 : 6 GHz
8 : 8 GHz

— MAGNETIC FIELD
---- ELECTRIC FIELD

F I G. 16
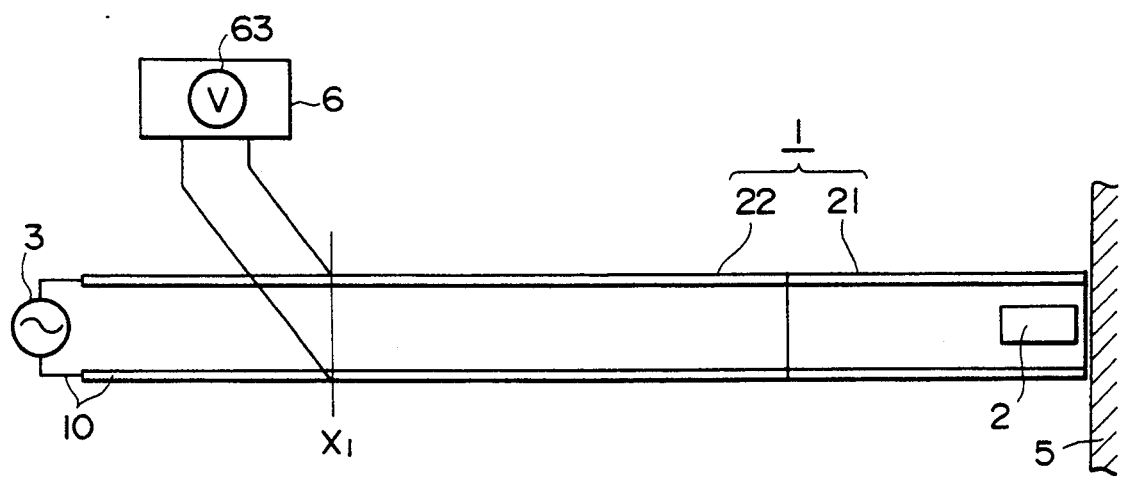
F I G. 17A
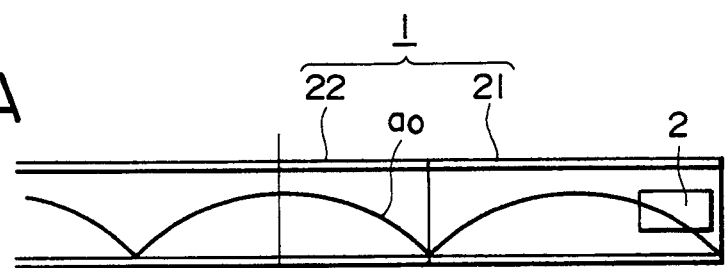
F I G. 17B
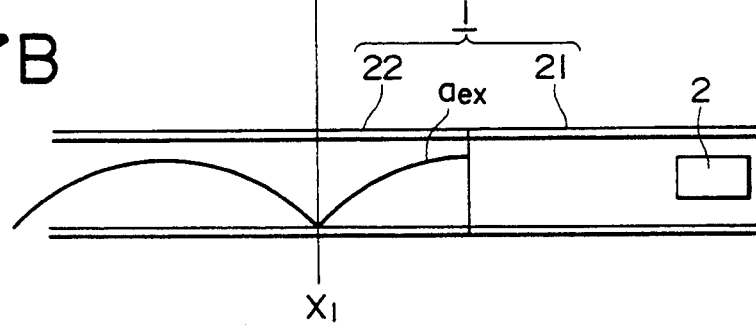

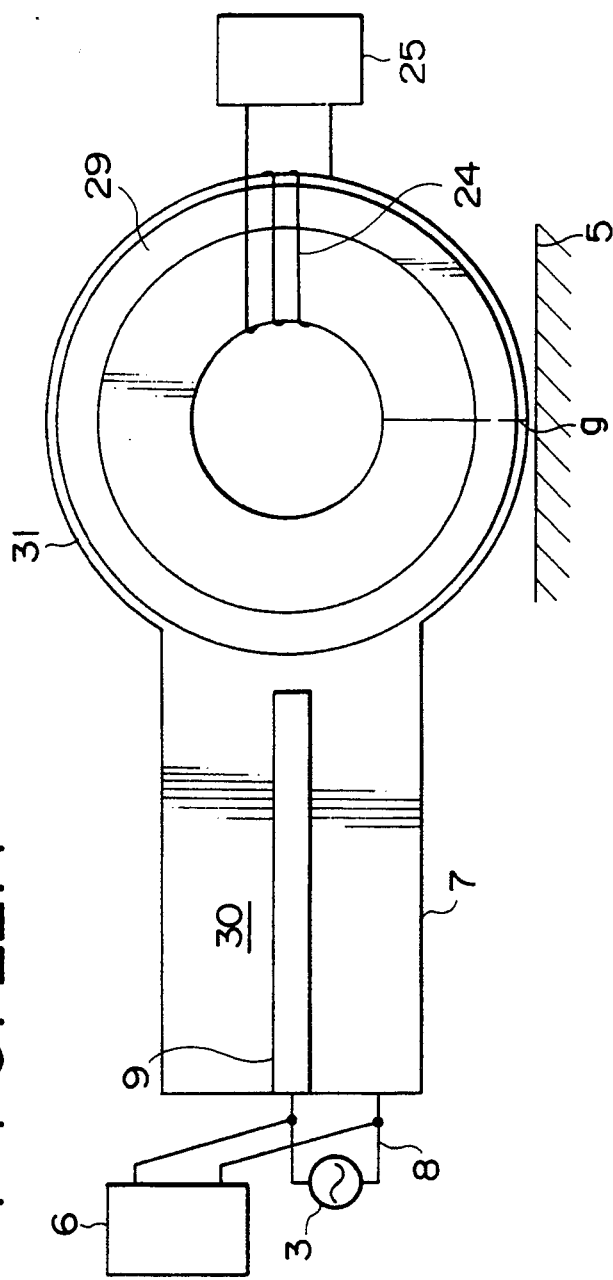
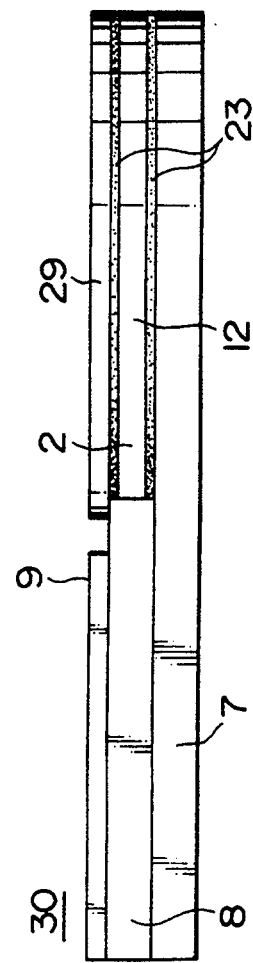
FIG. 22A
FIG. 22B

F I G. 24
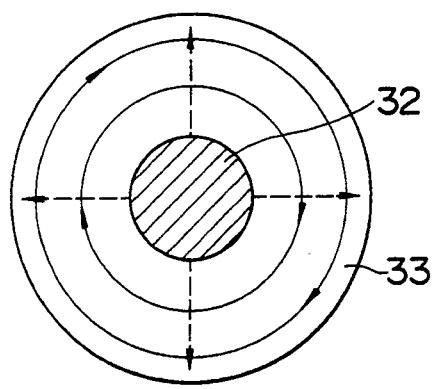
F I G. 25
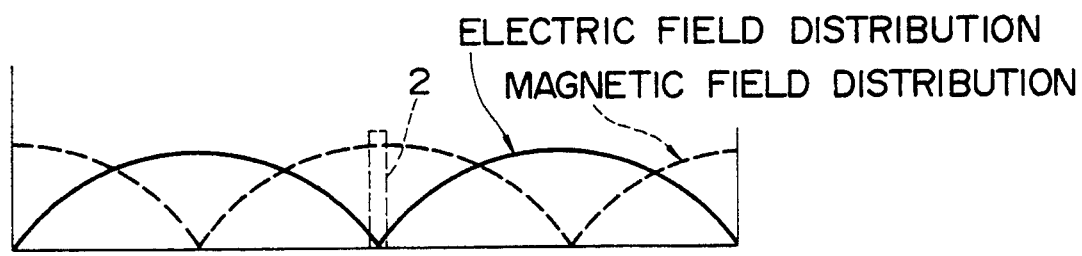
ELECTRIC FIELD DISTRIBUTION
MAGNETIC FIELD DISTRIBUTION
F I G. 26
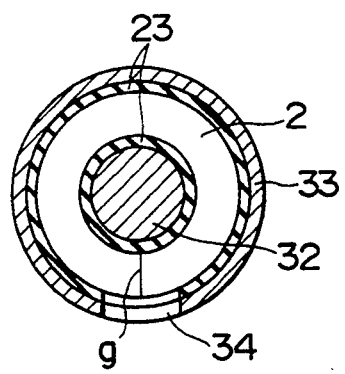

F I G. 27
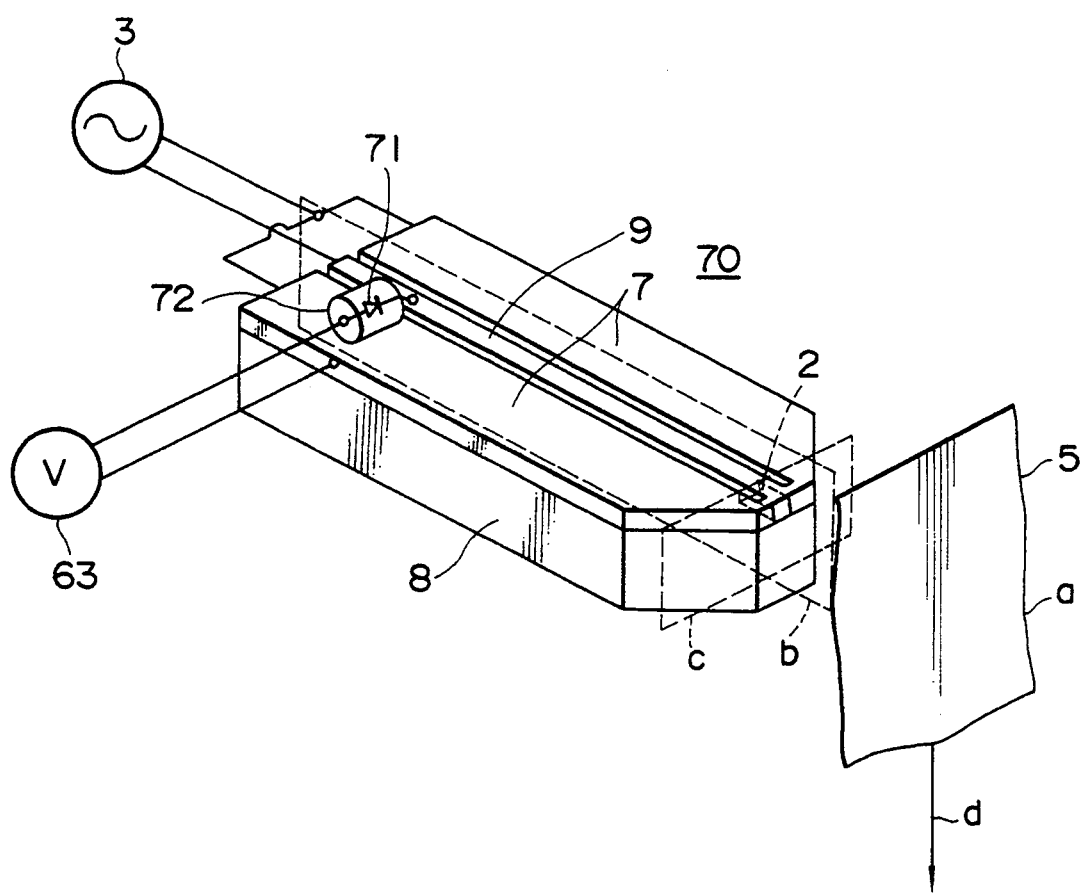

MARKER

0 : 130 MHz
1 : 1 GHz
2 : 2 GHz
3 : 3 GHz
4 : 4 GHz
5 : 5 GHz

F I G. 32
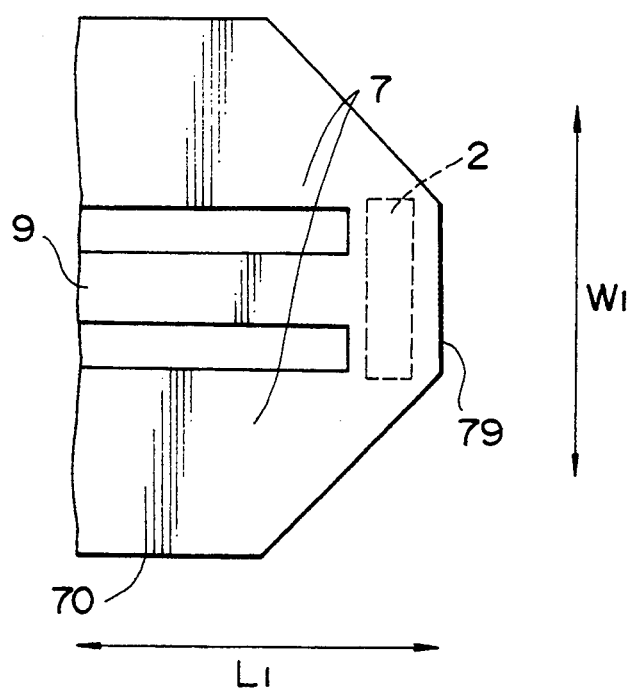

MAGNETIC REPRODUCING HEAD HAVING A DISTRIBUTED-CONSTANT CIRCUIT TYPE MAGNETIC FIELD DETECTOR

BACKGROUND OF THE INVENTION

1. Field of the Invention

The present invention relates to a distributed-constant circuit type magnetic field detector for detecting an external magnetic field working on a novel principle and suitable for use, for example, in a magnetic reproducing head which detects a signal magnetic field from a magnetic recording medium such as a magnetic tape, a magnetic disk, and a floppy disk.

2. Description of the Related Art

In reproducing magnetic record recorded on magnetic recording media, ring-shaped inductive magnetic heads utilizing electromagnetic induction have long been used. However, with the recent increase in recording density and operating frequency, various problems are arising.

First, the increase in the recording density is lowering the relative speed between the magnetic reproducing head and the recording medium. Hence, the reproduced output power by the inductive reproducing head is becoming extremely lower.

To cope with this situation, development and practical use of magnetoresistive effect (MR) reproducing heads are being advanced. The MR head is that of a magnetic flux sensitive type not dependent on its relative speed with the magnetic recording medium. Since the reproduced output by it is proportional to the current passed through the MR element, it is expected theoretically that the voltage will become higher the larger the current is. In practice, however, there is an upper limit to it because of heat to be produced by the current flow. On the other hand, since the reproduced output power is proportional also to the MR ratio of the MR element, materials having greater MR ratio are being intensively searched for. At present, Permalloy is being used chiefly, but its reproducing output power is not sufficient because its MR ratio is not higher than 2% or so. Besides, there is a big problem with the MR head that it produces Barkhausen noise to deteriorate the S/N ratio.

As another magnetic reproducing head of a magnetic flux sensitive type, there is proposed a magnetic reproducing head utilizing a change in the resonance characteristic of a coil by an external magnetic field (for example, Preprints for Spring National Conference of the Institute of Electronics, Information and Communication Engineers, 1990, pp. 5–35). However, this proposed head is not adapted to be a distributed-constant circuit and, further, permeability of the magnetic member used therein is in the frequency domain under 1 GHz.

As described above, with the recent rapid increase in the information quantity to be recorded, there are strong demands for higher recording density and higher-frequency performance in magnetic reproducing. These demands are especially strong in the field of hard disk units as external memory for video equipment and computers. Video equipment is required to support the high-definition television and digital television coming into existence and hard disk units are urged to support the extended scale of software and increased quantity of processed data and so on accompanying improvement in performance of computers. To meet the demands for higher recording density and performance at higher frequency, it is necessary for the magnetic reproducing head to be highly sensitive and excellent in high-frequency characteristics.

SUMMARY OF THE INVENTION

An object of the present invention is to provide a magnetic field detector functioning with high sensitivity and excellent high-frequency characteristics.

According to the present invention, there is provided a distributed-constant circuit type magnetic field detector which comprises a magnetic member whose permeability varies with changes in a magnetic field applied thereto disposed at a point where a magnetic field is produced in a distributed-constant circuit excited with an electromagnetic wave and means for detecting a change in electromagnetic field distribution in the distributed-constant circuit produced by a variation in permeability of the magnetic member upon application thereto of a magnetic field to be detected, whereby the magnetic field to be detected is detected.

The present invention makes it possible to achieve magnetic reproduction, i.e., magnetic detection, with high sensitivity and excellent high-frequency characteristics. When applied to a magnetic reproducing head, it can effectively meet the demand for magnetic recording of higher packing density and at higher frequency.

BRIEF DESCRIPTION OF THE DRAWINGS

FIGS. 1A and 1B are a structural drawing and a voltage distribution diagram of an example of a distributed-constant circuit type magnetic field detector according to the present invention;

FIG. 2 is an explanatory diagram of a standing wave for explaining operation of an example of apparatus of the invention;

FIG. 16 is a structural drawing of another example of apparatus of the invention;

FIGS. 17A and 17B are explanatory diagrams of resonant states of a distributed-constant circuit including a distributed-constant resonator;

FIGS. 22A and 22B are a plan view and a side view of an example of apparatus of the invention;

FIG. 24 is a diagram showing electromagnetic field distribution in a distributed-constant circuit;

FIG. 25 is a diagram showing electromagnetic field distribution in the axial direction of a distributed-constant circuit in the arrangement of FIG. 23;

FIG. 26 is a transverse sectional view of the distributed-constant circuit of FIG. 23;

FIG. 27 is a perspective view of an example of apparatus of the invention;

FIG. 32 is a plan view of the main portion of a coplanar waveguide line in an example of apparatus of the invention;

DETAILED DESCRIPTION OF THE PREFERRED EMBODIMENTS

Figure 3:
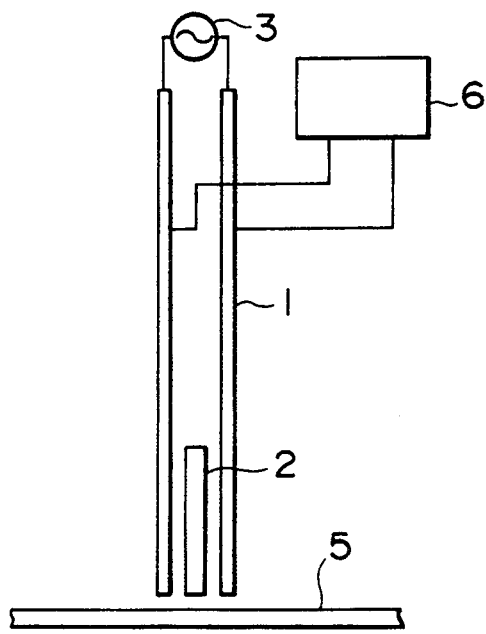
FIG. 3 is a structural drawing of an example of apparatus of the invention.

The present invention is directed to the provision of a distributed-constant circuit type magnetic field detector capable of detecting external magnetic field, namely, detecting existence or nonexistence and intensity of an external magnetic field, and, more particularly, detecting with high sensitivity a signal magnetic field generated by magnetic record made on a magnetic recording medium and forming a magnetic reproducing head meeting the demand for achievement of higher packing density and performance at higher frequency.

The basic structure of the present invention, as shown in the structural drawing of FIG. 1A, has a magnetic member 2, of which permeability $\mu$ (the permeability herein refers to complex permeability) varies with changes in external magnetic field applied thereto, disposed at a point where a magnetic field is generated in the circuit of a distributed constant circuit 1 excited with an electromagnetic wave.

More specifically, the magnetic member 2 is set up at a point where a magnetic field is generated when the distributed-constant circuit 1 incorporating the magnetic member 2 is excited by an oscillator 3.

A magnetic field to be detected is directly or indirectly applied to the magnetic member 2, whereby the permeability of it is varied, and the change in the electromagnetic field distribution in the distributed-constant circuit 1 due to the variation in the permeability is detected, and thus the magnetic field to be detected is detected.

According to another arrangement of the present invention, the distributed-constant circuit 1 including the magnetic member 2 in the above described basic structure has its terminal specially arranged to be impedance-unmatched so that a standing wave is produced.

The standing wave voltage dependent on a change in the magnetic field to be detected applied to the magnetic member 2 is amplitude-detected at a point of the distributed-constant circuit 1, where the standing wave voltage exhibits its substantially minimum value (a point of node) under the condition of no magnetic field to be detected applied thereto, and thereby, the detection of the magnetic field to be detected is achieved.

According to another arrangement of the present invention, at least a portion of the distributed-constant circuit 1 in the above described basic structure is provided with a distributed-constant resonator.

A magnetic member 2 is disposed at a point where a magnetic field is generated within the distributed-constant resonator. A change in the resonance characteristic of the resonator due to a variation in the permeability of the magnetic member 2 dependent on the magnetic field to be detected applied to the magnetic member 2 is detected and, thereby, detection or measurement of the magnetic field to be detected is achieved.

According to a further arrangement of the present invention, the circuit in the above described basic structure has the magnetic member 2 provided with a magnetic yoke conducting the magnetic field to be detected such that a magnetic circuit including the magnetic member 2 is formed. According to a still further arrangement of the invention, a distributed-constant circuit 1 has a magnetic member whose permeability varies upon application of an external magnetic field disposed in the vicinity of its terminal portion and, in addition, the terminal portion is short-circuited.

According to another arrangement of the present invention, there is provided a magnetic member 2 whose permeability is varied upon application of the magnetic field to be detected at the terminal portion of a coplanar waveguide line or a coplanar line, and the change in the reflection coefficient at the terminal portion due to the variation of the permeability is detected, and thereby, the detection of the magnetic field to be detected is achieved.

According to another arrangement of the present invention, there is disposed a magnetic member 2 whose permeability is varied upon application of the magnetic field to be detected at the terminal portion of the above coplanar waveguide line or the coplanar line, and it is adapted such that the variation in the permeability thereof at a frequency within the range from 1 Ghz to 10 GHz is utilized.

According to another arrangement of the present invention, a coplanar line having a portion in which the line width is gradually increased while the ratio between conductor width and conductor spacing is kept constant is used as the above coplanar waveguide line or coplanar line.

According to another arrangement of the present invention, the coplanar waveguide line or coplanar line has the top surface covered with a dielectric member.

According to another arrangement of the present invention, a D.C. current is passed through the above coplanar waveguide line or coplanar line so that a bias magnetic field is applied to the magnetic member 2.

Functioning of the apparatus of the present invention according to the basic structure will be described with reference to FIG. 1.

As described above with reference to FIG. 1A, when the distributed-constant circuit 1, or, in concrete terms, a distributed-constant circuit 1 of a microstrip line, a waveguide, a coaxial cable, or the like, is exited by the oscillator 3, a progressive wave is generated if the terminal. i.e., the load terminal, is in an impedance-matched state, and a reflected wave is produced in addition to the progressive wave if the terminal is in an impedance-unmatched state, so that a standing wave is produced by superposition of the progressive and reflected waves. The standing-wave ratio is maximized when the terminal of the distributed-constant circuit 1 is open or short-circuited.

In the present invention, there is provided a distributed-constant circuit 1 including a magnetic member 2 whose permeability varies with changes in a magnetic field applied thereto, and the magnetic member 2 is disposed at the point in the circuit where a magnetic field is generated when it is put in an oscillating state. Supposing now that there is produced an electromagnetic wave having electric field (voltage) distribution as shown in FIG. 1B at an instant in the state where no magnetic field to be detected is applied to the magnetic member 2, the distribution of the electromagnetic field along the distributed-constant circuit 1 changes as the permeability of the circuit varies. Accordingly, if an external magnetic field $H_{ex}$, i.e., a magnetic field to be detected $H_{ex}=H$, is applied to the magnetic member 2 and thereby the permeability $\mu$ (real part $\mu_r$ and imaginary part $\mu_i$) is varied, the voltage distribution shown in FIG. 1B is also varied. Therefore, the magnetic field to be detected can be detected by detecting, for example, phase, amplitude, or wavelength at a specific point $x_s$ of the distributed-constant circuit 1.

The curve 4Z in FIG. 2 shows a waveform of a standing wave of which the standing-wave amplitude $|V|$ exhibits its minimum value $V_0$ at the specific point $x_s$, under the condition of an external magnetic field $H_{ex}$ being not applied, i.e., $H_{ex}=0$, for example, and the terminal of the distributed-constant circuit 1 being in an unmatched state. Referring to FIG. 2, the ratio between the maximum value and the minimum value of the standing-wave amplitude is called the standing-wave voltage ratio, $\lambda$ denotes the standing-wave wavelength, and $\lambda/2$ denotes the interval at which the crests or the troughs of the standing wave cycle. The standing-wave ratio is maximized when the terminal is open or short-circuited.

In the above described state, if the electromagnetic field $H_{ex}$ applied to the magnetic member 2 is changed to $H_{ex}=H$, i.e., if the magnetic field to be detected is applied, the magnetic-field distribution along the distributed-constant circuit 1 is changed, and as a result, for example as shown by the curve $4_{ex}$ in dotted line in FIG. 2, the standing-wave ratio, the standing-wave amplitude $\lambda$, and/or the phase is changed and the standing-wave amplitude $|V|$ at the point $x_s$ is changed to $V_{ex}$. Therefore, by rectifying the $V_{ex}$ upon application of the magnetic field to be detected for example at the point $x_s$ where the voltage $|V|$ exhibits its minimum value $V_0$ under the condition of no magnetic field to be detected being applied, a great change in voltage can be obtained and detection with high sensitivity can be achieved. However, when the voltage curve 4Z deviates from the ideal state and its waveform therefore exhibits a null at the point of the minimum value $V_0$, the point for voltage rectification $x_s$, for example, is changed to another point slightly shifted from the point of $V_0$.

Further, when a portion of the distributed-constant circuit 1 is formed of a distributed-constant resonator and the magnetic member 2 is disposed within the resonator to provide another arrangement of the present invention, only the electromagnetic wave satisfying the resonance condition is excited within the resonator. Therefore, the variation in the permeability of the magnetic member 2 gives a great effect on the resonance characteristic to change the resonance wavelength and resonance amplitude (the value Q), and thereby the state of excitation of the electromagnetic wave within the resonator is greatly changed leading to a great change in the electromagnetic-wave distribution in the distributed-constant circuit 1. Thus, detection of the magnetic field to be detected can be achieved with higher sensitivity.

Further, when it is arranged such that the magnetic member 2 is magnetically coupled with a magnetic yoke and the magnetic field to be detected is introduced through the magnetic yoke, the magnetic field to be detected can be effectively applied to the magnetic member 2. Therefore, especially when the arrangement is applied to a reproducing magnetic head for reading the record on a magnetic recording medium, a high reproducing sensitivity can be obtained.

The distributed-constant circuit 1 of the present invention, as shown in FIG. 1A indicating its basic structure, comprises a distributed-constant circuit 1, or in concrete terms, a microstrip line, a coaxial cable, or the like, and it is adapted to be excited by an oscillator 3 through a microwave transmission line 10 such as a coaxial cable.

The distributed-constant circuit 1 is arranged to incorporate a magnetic member 2 made of a soft magnetic material, such as CoTaZr amorphous, whose permeability $\mu$, the real part $\mu_r$ or imaginary part $\mu_i$, varies with changes in the magnetic field applied thereto.

The position where the magnetic member 2 is disposed is selected at a point where a strong magnetic field is generated when the distributed-constant circuit 1 incorporating the same is excited.

The distributed-constant circuit 1 can have its terminal, or the so-called load terminal, in either of a matched state and an unmatched state. When the terminal is in the matched state, there is produced a progressing wave, and when it is in the unmatched state, there is produced a standing wave by generation of the reflected wave as described above. Especially when the terminal is in a short-circuited or open state, the standing-wave ratio becomes great.

FIG. 3 is a schematic structural drawing of an example of the present invention applied to a magnetic reproducing head for reading a record signal on a magnetic recording medium 5. In this case, the magnetic member 2 made of the above described soft magnetic material whose permeability varies with changes in the magnetic field applied thereto is disposed for example at the terminal portion of the distributed-constant circuit 1, and the same is arranged to be closely confronted with the magnetic recording medium 5 and moved relative to the medium 5 so that a leakage signal magnetic field from the record magnetization on the medium 5 is applied to the magnetic member 2 to thereby cause a variation in its permeability. A change in the electromagnetic field distribution due to the variation in the permeability caused by the signal magnetic field is measured as, for example, a change in voltage, or a change in amplitude or phase, at a specific point in the distributed-constant circuit 1 by a detector 6, such as a network analyzer, and/or a rectifier plus a voltmeter.

Figure 4:
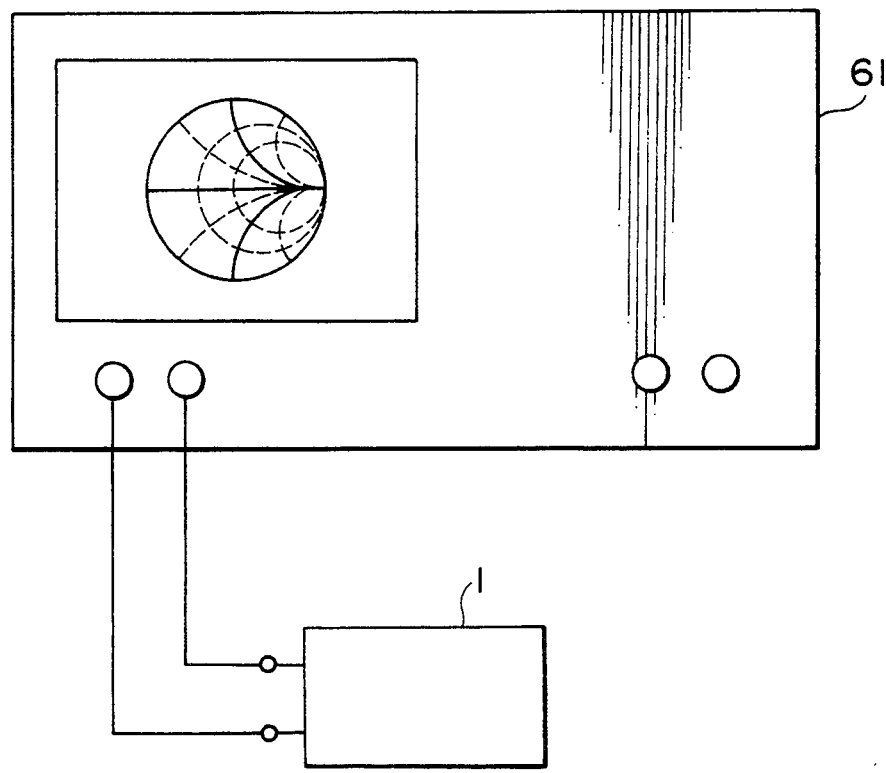
FIG. 4 is a drawing of an arrangement for measuring the reflection coefficient of a distributed-constant circuit using a network analyzer.
Figure 5:
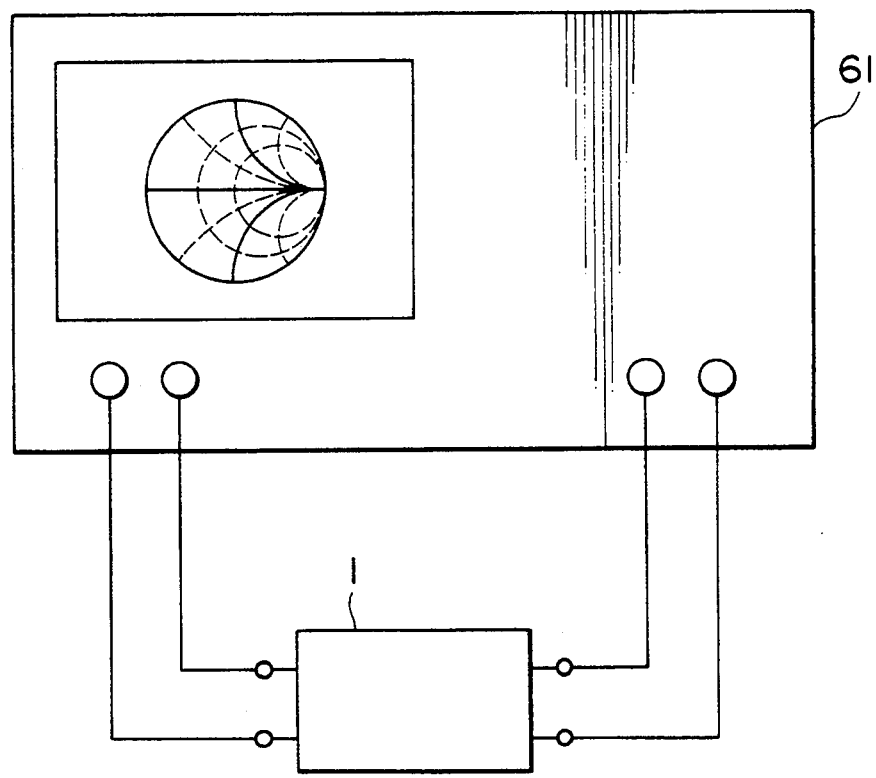
FIG. 5 is a drawing of an arrangement for measuring the transmission coefficient of a distributed-constant circuit using a network analyzer.

FIG. 4 is a diagram showing an arrangement in which the reflection coefficient $S_{11}$ of a distributed-constant circuit 1 is measured by a network analyzer 61 and FIG. 5 is a diagram showing an arrangement in which the transmission coefficient $S_{21}$ is measured.

Figure 6:
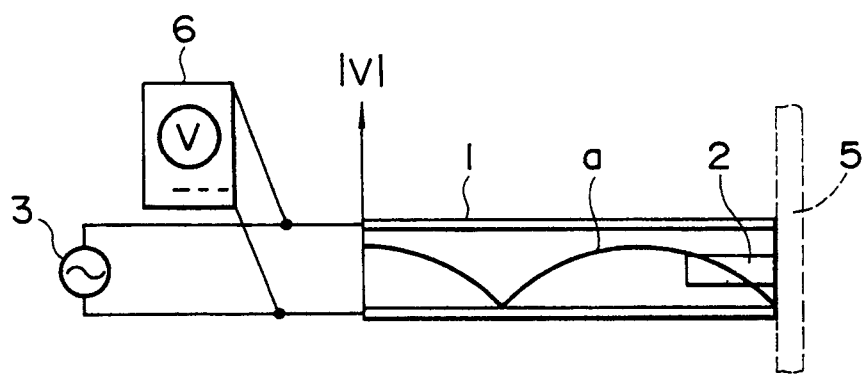
FIG. 6 is a structural drawing of another example of apparatus of the invention.

When the terminal of the distributed-constant circuit i is short-circuited in the arrangement described in FIG. 3 as shown in FIG. 6, the voltage distribution of the standing wave produced when the circuit is excited becomes as shown by the curve a in FIG. 6, that is, the voltage is minimized at the terminal where a node is formed. Therefore, the current is maximized at the terminal and the generated magnetic field is maximized at the terminal. Accordingly, the distribution of the standing wave is most strongly affected by the permeability at the terminal portion.

That is, by adopting the arrangement with the terminal portion short-circuited as shown in FIG. 6 and a magnetic member 2 whose permeability is varied by changes in the external magnetic field disposed in the vicinity of the terminal portion, the standing wave is most strongly affected by the change in the external magnetic field.

Therefore, when using the detector of FIG. 6 as a magnetic reproducing head and the terminal of the distributed-constant circuit 1 is directly held close to a magnetic recording medium 5 to detect the signal magnetic field from the medium 5, it is preferred to have the magnetic member disposed at the terminal.

Further, when the terminal portion is short-circuited, the electric field generated at the terminal portion is decreased as described above. Therefore, the change in the admittivity at the terminal portion produces little effect on the standing-wave distribution. Accordingly, noise to be produced by electrical causes when the terminal is brought closer to the magnetic recording medium 5 can be reduced.

Furthermore, in the detection of the signal magnetic field from the magnetic recording medium 5 according to record magnetization on the medium 5, that is, in the signal reproduction, even if an electrical connection is produced between the distributed-constant circuit 1 and the medium 5 when they are brought into contact, current is prevented from flowing between the circuit 1 and the medium 5 in case the terminal portion is short-circuited and, in addition, the side of the medium 5 is grounded. Therefore, noise is prevented from occurring on such occasion.

Figure 7A:
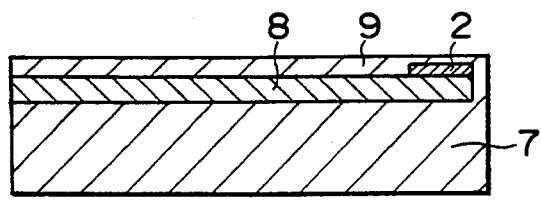
FIGS. 7A and 7B are a longitudinal sectional view and a perspective view of an example of apparatus of the invention.
Figure 7B:
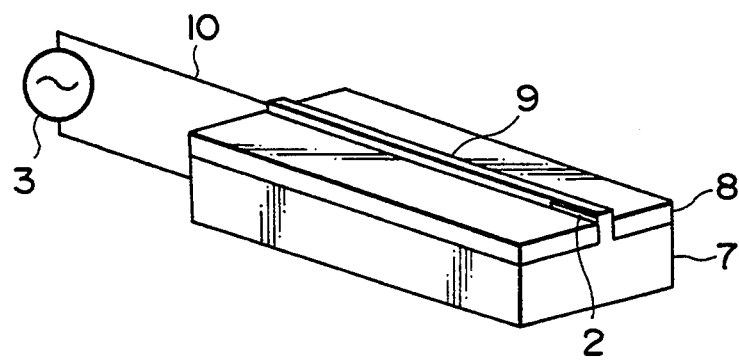

The distributed-constant circuit 1 in the present invention can be provided by a microstrip type arrangement for example as show in FIG. 7.

In this case, the circuit (FIGS. 7a and 7b) is structured of a line conductor 9 made of Au, Cu, or the like in a strip form disposed on a ground conductor 7 made of Au, Cu, or the like through a dielectric member 8 made of glass, $Al_2O_3$, sapphire, or similar material whose permittivity is high and high-frequency loss is low and through, at its portion on the terminal side, a magnetic member 2 made of an amorphous soft magnetic thin film of $Co_{75}Ta_{11}Zr_{14}$, and the line conductor 9 and the ground conductor 7 are short-circuited at the terminal.

Figure 8:
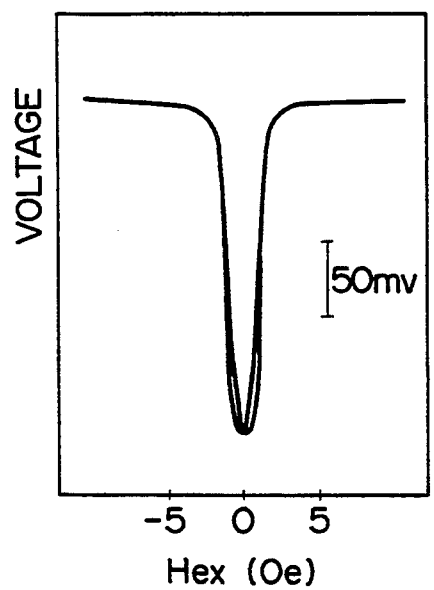
FIG. 8 is a graph showing the relationship between external magnetic field (magnetic field to be detected) and detected voltage.

Also in the distributed-constant circuit 1 provided by the above microstrip line type waveguide line, if a standing wave is produced in the state where no external magnetic field is applied, i.e., where $H_{ex}=0$, the excited state changes when an external magnetic field $H_{ex}=H$ is applied. Therefore, by rectifying voltages according to curves $4Z$ and $4_{ex}$ and measuring the change in voltage at a specific point in the strip line, or at a specific point for example on the transmission line 10 connecting the strip line and the oscillator indicated by dotted line A in FIG. 2, detection or measurement of the external magnetic field $H_{ex}$ can be achieved. FIG. 8 shows the relationship between the detected voltage and the external magnetic field (magnetic field to be detected), from which it is known that a change in magnetic field of 1 (Oe), for example, can be detected with such high sensitivity as a voltage change as great as approximately 200 mV. In this case, referring to the structure shown in FIG. 7, the line conductor was 30 μm wide and 1 μm thick, and the magnetic member 2 was 1 mm long, 30 μm wide, and 0.5 μm thick.

Figure 9:
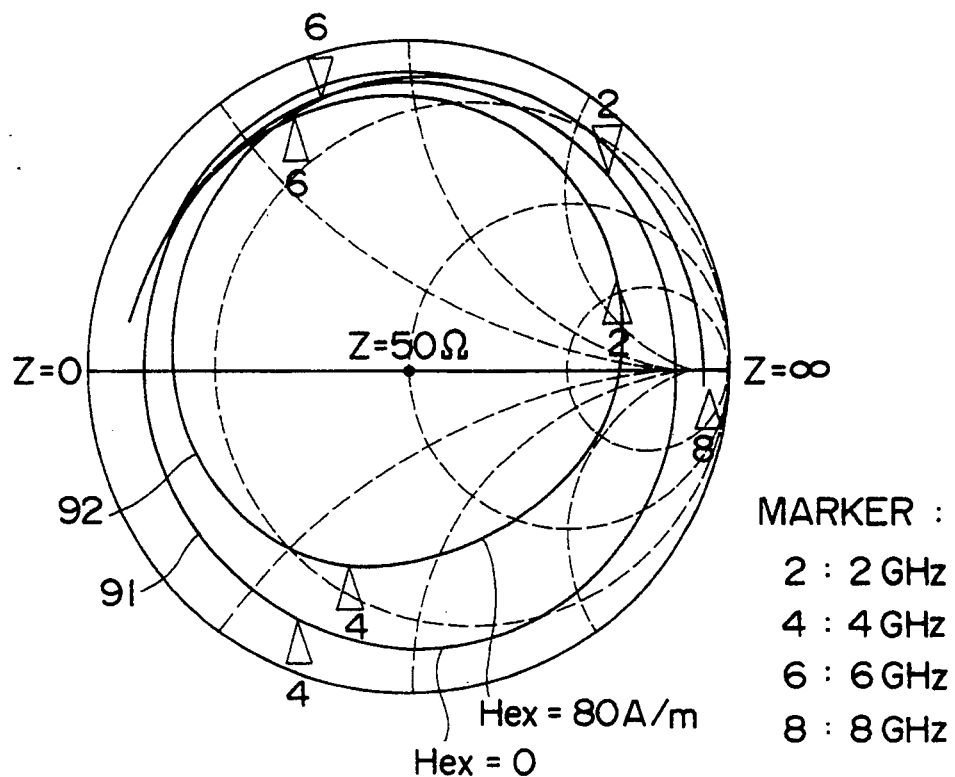
FIG. 9 is a diagram showing results of measurement with a network analyzer.

Further, the dependency on the external magnetic field of the impedance of the distributed-constant circuit 1 of the above described structure was measured using a network analyzer (HP8719A made by Hewlett-Packard Corp.) within the range of frequencies f from 130 MHz to 8 GHz. The test results are shown in FIG. 9. In FIG. 9, the curve 91 corresponds to the case where the external magnetic field $H_{ex}=0$ and the curve 92 corresponds to the case where $H_{ex}=80$ A/m. The points of each curve indicated by $\Delta 2$, $\Delta 4$, $\Delta 6$, and $\Delta 8$ show the values when f=2 GHz, f=4 GHz, f=6 GHz, and f=8 GHz, respectively. As apparent from the diagram, the input impedance of the waveguide line, hence the electromagnetic-wave distribution in the waveguide line, is dependent on the external magnetic field $H_{ex}$.

According to the test results by means of the network analyzer, it is known that the external magnetic field, i.e., the magnetic field to be detected $H_{ex}$, can be detected.

Further, referring to FIG. 10, a case where a microstrip line type structure is used will be described below in detail. Parts in FIG. 10 corresponding to those in FIG. 7 are denoted by like reference numerals.

Also in this case, the structure has a ground conductor 7 and a line conductor 9 with for example a dielectric member 8 and a magnetic member 2 interposed therebetween.

Figure 11:
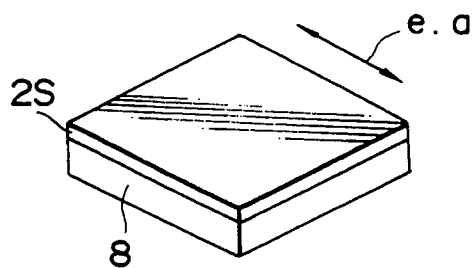
FIG. 11 is an explanatory drawing of a fabrication method of a microwave strip line.

In fabricating the device, as shown in FIG. 11, a dielectric member 8 formed of a substrate of $Al_2O_3$, sapphire, or a similar material whose permittivity is high and high-frequency loss is low is prepared and a thin film 25 of an amorphous soft magnetic material $Co_{75}Ta_{11}Zr_{14}$ of a thickness of 0.7 $\mu m$, for example, is deposited on the substrate by sputtering.

In order that the permeability $\mu$ of the thin film 25 of the soft magnetic material exhibits a sharp magnetic-field dependency, it is heat-treated under application of a fixed magnetic field of 1 kOe, for example, in a temperature of 300° C. for one hour, whereby it is provided with uniaxial anisotropy of an anisotropic magnetic field Hk of approximately 0.2 (Oe), for example.

On the entire surface of the soft magnetic material thin film 25, a good conductive layer, not shown, of a material with good conductivity such as Au or Cu is deposited to a thickness of 1 $\mu m$ by sputtering.

Then, the good conductive layer, together with the underlying soft magnetic material thin film 25, is subjected to pattern etching by photolithography into a strip form for example with a length of 2 mm and a width of 30 $\mu m$, while having the axis of easy magnetization e.a of the soft magnetic material thin film 25 virtually aligned in the lateral direction. Thus, a line conductor 9 in a strip form made of a good conductive Cu layer is formed and, at the same time, a magnetic member 2, which is formed of a portion of the soft magnetic material thin film 25 and permeability of which is dependent on the external magnetic field, is formed underlying the conductive layer.

Then, the dielectric member 8 with the magnetic member 2 and the line conductor 9 formed thereon is joined to a block with good conductivity such as a Cu block constituting the ground conductor 7.

In this way, a microstrip line whose load terminal 1a being, for example, opened is structured.

In the above described microstrip type distributed-constant circuit 1, an oscillator 3, i.e., a high-frequency power source, is connected between the line 9 and the ground conductor 7 through a transmission line 10 formed for example of a coaxial cable.

The distributed-constant circuit 1 formed of the microwave waveguide line is excited by means of the oscillator 3, i.e., the high-frequency power source, set to a frequency for example of about 1 GHz and the exciting frequency is adjusted so that a node of the standing wave is formed at the point $x = x_s$ as indicated in FIG. 2 by the curve 4Z drawn by solid line. Then, the standing-wave voltage at the point $x = x_s$ is rectified by means of a rectification circuit 62 and the voltage is measured by a voltmeter 63. Thus, as described with reference to FIG. 2, the magnetic field can be detected as a change between $V_0$ and $V_{ex}$.

Figure 12:
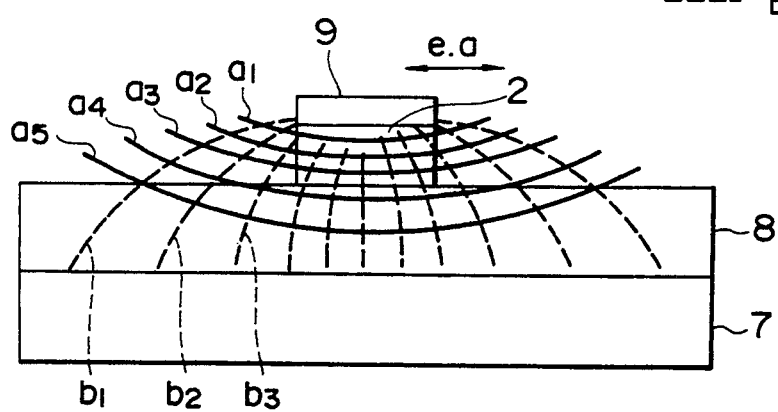
FIG. 12 is a diagram showing distribution of magnetic field and electric field in the microwave strip line.

FIG. 12 is a transverse sectional view of the microstrip line forming the distributed-constant circuit 1. In the diagram, the thin lines $a_1, a_2, a_s, \ldots$ indicate distribution of the magnetic field and the thin broken lines $b_1, b_2, b_3, \ldots$ indicate distribution of the electric field. In this case, the magnetic field is generated in the lateral direction of the line conductor 9. Therefore, when the magnetic member 2 having its axis of easy magnetization e.a in the lateral direction is placed there, the permeability $\mu$ with respect to the lateral magnetic field generated by the microwave can be changed by application of the external magnetic field $H_{ex}$ along the axis of difficult magnetization. As a result, the standing-wave ratio and/or the standing-wave amplitude $\lambda$ is changed.

The detector, i.e., magnetic head, of the above described structure is brought into position, as described with reference to FIG. 3, such that the load terminal (open terminal) 1a of the microstrip type distributed-constant circuit 1 is closely confronted with a magnetic recording medium (not shown) so as to detect a leakage magnetic field from the record on the magnetic recording medium, i.e., a signal magnetic field, as the external magnetic field $H_{ex}$. Thus, the magnetic signal can be taken out by being converted to an electric signal.

In this case, the permeability of the magnetic member 2 in the direction of its axis of easy magnetization is small when no external magnetic field $H_{ex}$ is applied thereto in the direction perpendicular to its axis of easy magnetization, but it gradually increases as the magnetic field in the direction perpendicular to the axis of easy magnetization is applied thereto and gradually increased. The permeability reaches a maximum at around $H_{ex} = Hk$, and then it decreases as the magnetic field is increased further.

If the frequency of the high-frequency power source, i.e., the carrier frequency f, is set to 1 GHz, for example, and even though the frequency of the record signal magnetic field $H_{ex}$ is set to such a sufficiently high frequency as about 100 MHz being one digit lower than the carrier frequency, the carrier component can be removed by amplitude-detection by means of the rectification circuit 62 and only the change in $H_{ex}$ can be taken out as a voltage change.

Figure 13:
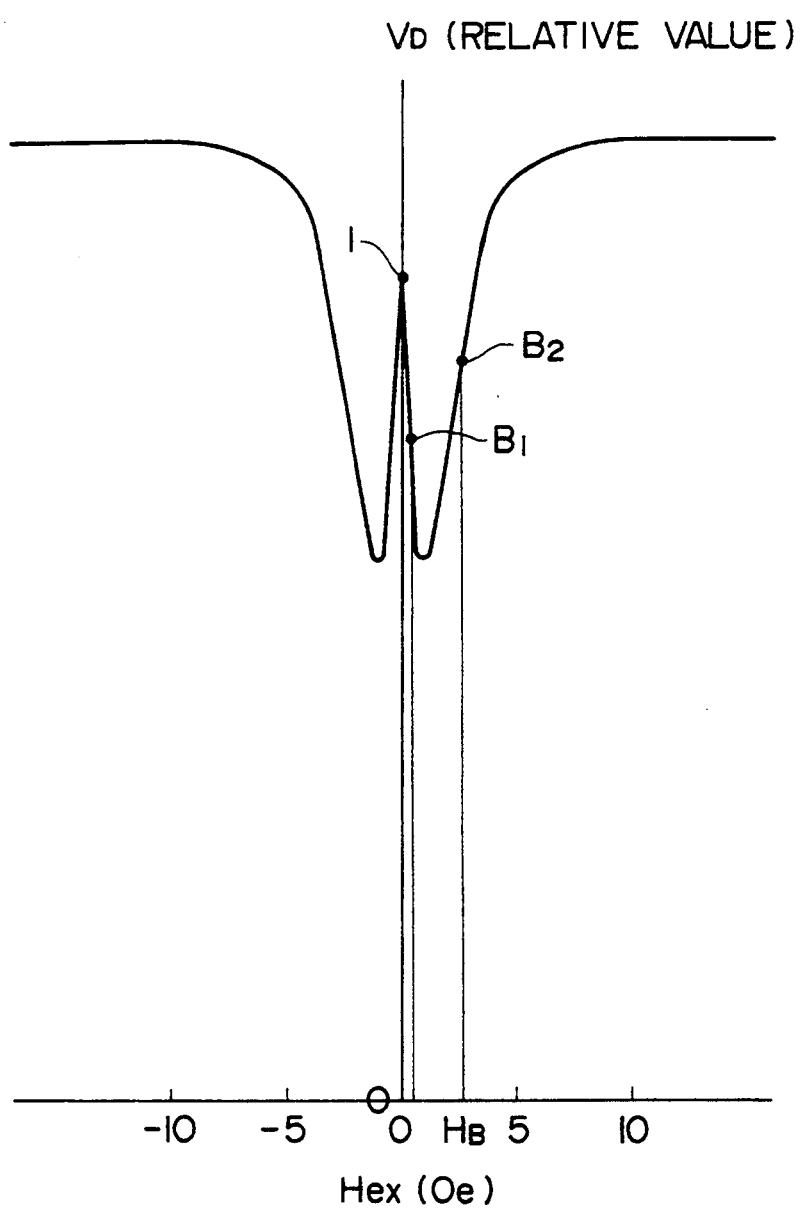
FIG. 13 is a detected voltage-magnetic field characteristic.

FIG. 13 shows the output voltage $V_D$ of the detector circuit measured against changing external magnetic field $H_{ex}$ under the condition of the above described arrangement being applied with no bias magnetic field.

Figure 10:
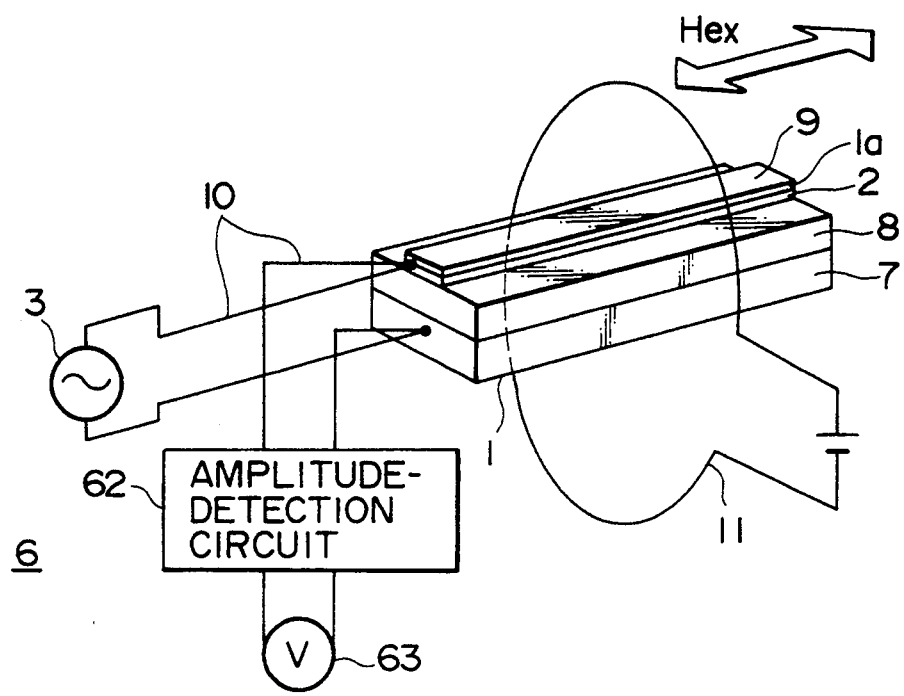
FIG. 10 is a structural drawing of another example of apparatus of the invention.

In this case, in practically detecting the magnetic field from the medium, a bias magnetic field application means 11 of an electromagnet or a permanent magnet is disposed as shown in FIG. 10 so that the center of operation is brought to the point $B_1$ or $B_2$ where the magnetic-field dependency of $V_D$ is the steepest and good in linearity. By providing the bias magnetic field $H_B$ in this way, an output with excellent sensitivity and small distortion can be obtained.

Although the example shown in FIG. 10 was such that the magnetic member 2 and the line conductor 9 are made in the same pattern, it is not necessarily needed to have them made in the same pattern.

Further, although the magnetic member 2 was of the structure included in the waveguide line formed of a microstrip line, the magnetic member 2 can be arranged as a portion of, or in place of, the dielectric member 8 when the magnetic member 2 has an insulating (dielectric) property, or it can be arranged as a portion of, or in place of, the conductor 7 or 9 when it has good conductivity.

Further, although the magnetic member 2 described with reference to FIG. 10 was made in a strip form and its axis of easy magnetization e.a was set in the lateral direction, the orientation of the axis of easy magnetization and the intensity of anisotropic magnetic field can be selected according to the purpose or manner of its use.

Figure 14:
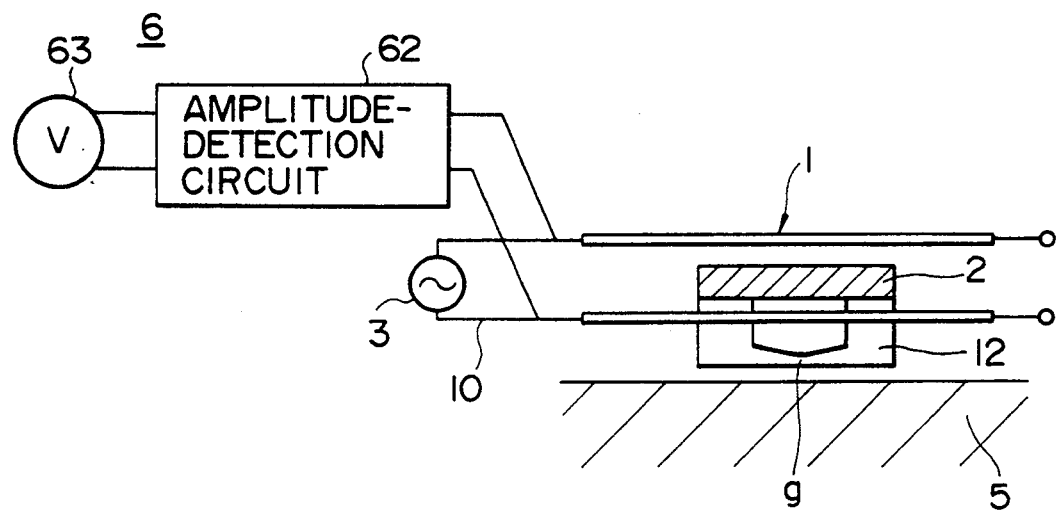
FIG. 14 is a structural drawing of another example of apparatus of the invention.

Further, although the above described examples were of the cases where the signal magnetic field from the magnetic recording medium 5 was directly applied to the magnetic member 2 of the distributed-constant circuit 1, it is also possible to prepare for example a magnetic yoke 12, which is formed of a soft magnetic member with high permeability in which a magnetic gap g is made as shown in FIG. 14, and dispose the magnetic member 2 in the magnetic path of the magnetic yoke 12.

When the magnetic yoke 12 is arranged as described above and the magnetic field to be detected is introduced through the gap g provided therein, the degree of freedom in selecting the position, form, and the like of the magnetic member 2 is made larger. Hence, the position, form, etc. of the magnetic member 2 can be set up so that the electromagnetic field in the distributed-constant circuit 1 is most greatly affected by it. Hence, the sensitivity can be improved. Further, the efficiency of application of the external magnetic field, i.e., the magnetic field to be detected, to the magnetic member 2 can be improved, whereby still higher sensitivity can be obtained. Especially when the structure is applied to a reproducing magnetic head to be arranged opposite to a magnetic recording medium 5, by arranging the gap g to be closely confronted with the magnetic recording medium 5, the leakage magnetic field from the record magnetization on the medium 5, i.e., the record signal magnetic field, can be satisfactorily read by it with high resolution and high sensitivity.

Figure 15:
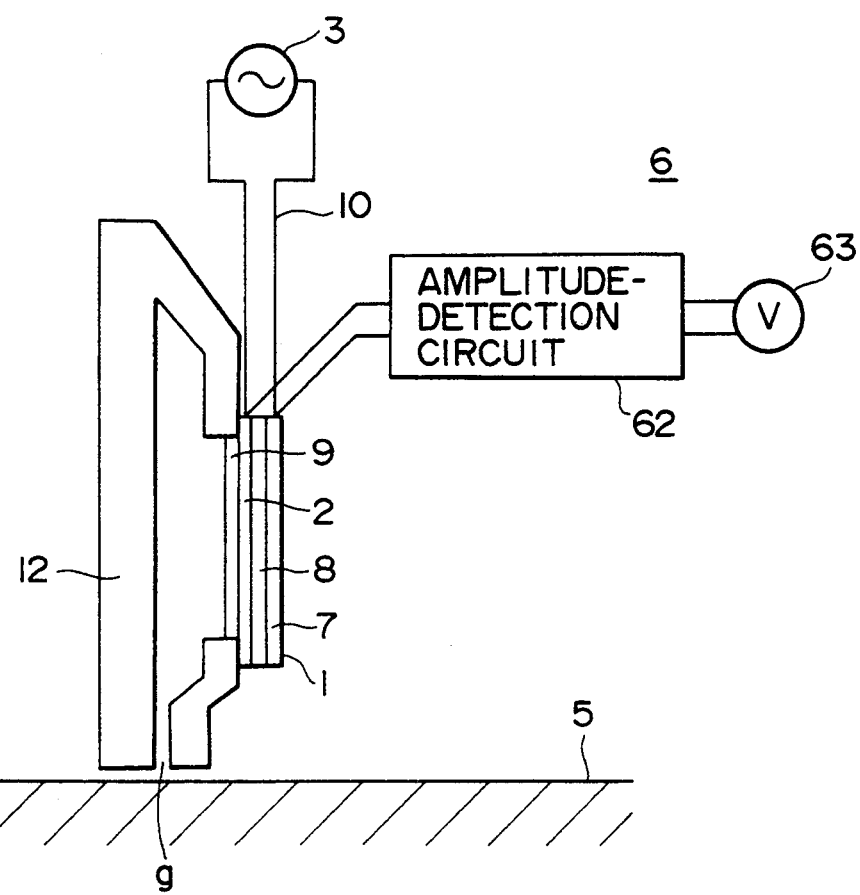
FIG. 15 is a structural drawing of another example of apparatus of the invention.

In an example shown in FIG. 15, a magnetic yoke 12 including a magnetic gap g is magnetically coupled for example with a distributed-constant circuit 1 of the microstrip line type waveguide line of the structure described in FIG. 10. Parts in FIG. 15 corresponding to those in FIG. 10 and FIG. 14 are denoted by like reference numerals and explanation of the same will therefore be omitted.

Further, the distributed-constant circuit 1 of the apparatus of the present invention can also be structured such that a portion of it is provided by a distributed-constant resonator. In such case, as shown in one example in FIG. 16, the distributed-constant circuit 1 is constituted of a distributed-constant resonator 21 and an external circuit 22.

The external circuit 22 is formed of a transmission line 10 connecting an oscillator 3 with the distributed-constant resonator 21 and a voltmeter 63, for example, as a detector 6 disposed at a specific point $x_1$ of the transmission line 10.

Further, a magnetic member 2 whose permeability varies with changes in the external magnetic field $H_{ex}$, i.e., the magnetic field to be detected, is disposed within the distributed-constant resonator 21.

The magnetic member 2 is disposed for example at such a point where the internal magnetic field of the distributed-constant resonator 21 including the magnetic member 2 is as strong as possible when it is excited at the resonant frequency $\omega_0$ and where the external magnetic field $H_{ex}$ can be detected most advantageously.

For example, when a reproducing magnetic head is formed with the above described arrangement, the resonator 21 will be disposed on the terminal side of the distributed-constant circuit 1 and the magnetic member 2 within the distributed-constant resonator 21 will be disposed on its terminal side and the terminal will be closely confronted with the magnetic recording medium 5 so that the signal magnetic field from the medium 5 as the magnetic field to be detected, i.e., the external magnetic field $H_{ex}$, may be applied to the magnetic member 2.

As a means for structuring the distributed-constant resonator 21, there is a method to short-circuit the distributed-constant circuit 1 at the boundary between the portion desired to be used as the distributed-constant resonator 21 and the portion to be used as the external circuit The high-frequency permeability $\mu$ can be divided into a real part $\mu_r$ and an imaginary part $\mu_i$. That is, $\mu$ can be expressed as $\mu = \mu_i + i\mu_r$.

In this case, $\mu_r$ or $\mu_i$ varies with changes in the external magnetic field $H_{ex}$.

First, the case where the variation of the real part of permeability $\mu_r$ is utilized will be considered. Suppose now that the resonant frequency of the distributed-constant resonator 21 is $\omega_0$ when $H_{ex}=0$ and the resonator is in a resonant state at the resonant frequency $\omega_0$ provided by the oscillator 3, in which the voltage distribution is as indicated by the curve $a_0$ in FIG. 17A. Then, if the external magnetic field is changed and the real part $\mu_r$ of the permeability $\mu$ of the magnetic member 2 is varied under an external magnetic field $H_{ex}=H$, the resonant frequency will deviate from $\omega_0$ and therefore the resonator 21 will stop resonating, and the voltage distribution will be changed and become as indicated by the curve $a_{ex}$ in FIG. 17B. Therefore, if the point $x_1$ for voltage detection, i.e., for voltage rectification, is set up at the position where the voltage is at its maximum value in the distribution under the condition of $H_{ex}=0$ in FIG. 17A, the voltage at the point $x_1$ will be lowered upon application of the magnetic field $H_{ex}$. Thus, detection of $H_{ex}$, for example detection of a signal magnetic field from record on a magnetic recording medium 5, that is, reproduction, can be achieved.

In the above case, the lower the loss in the distributed-constant circuit is and the smaller the electromagnetic coupling between the external circuit 22 and the distributed-constant resonator 21 is, the higher becomes Q of the distributed-constant resonator 21, and the higher Q of the resonator 21 is, the greater becomes the variation in the voltage due to the change in $H_{ex}$.

In the above described example, the distributed-constant resonator 21 was arranged to be resonant when $H_{ex}=0$ and to go out of resonant frequency when $H_{ex}=H$. It is also possible to arrange such that the resonator, conversely, becomes resonant when $H_{ex}=H$ and goes out of resonant frequency when $H_{ex}=0$.

A case where variation of the imaginary part $\mu_i$ of the permeability $\mu$ of the magnetic member 2 with changes in the external magnetic field is utilized will be described below.

Figure 18:
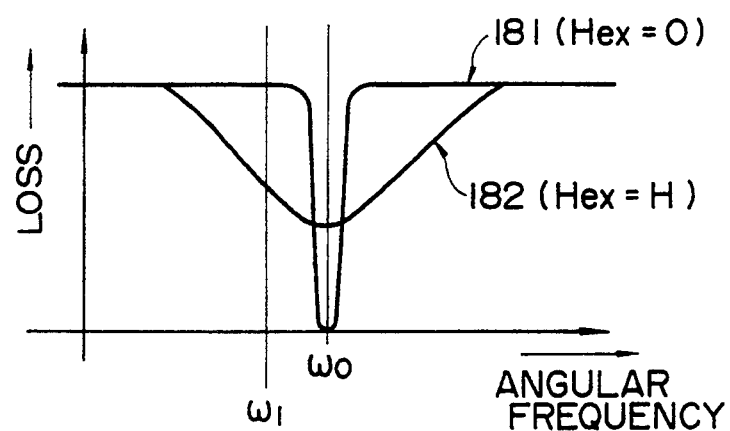
FIG. 18 is a graph showing relationships between Q of a resonator and external magnetic fields.
Figure 19A:
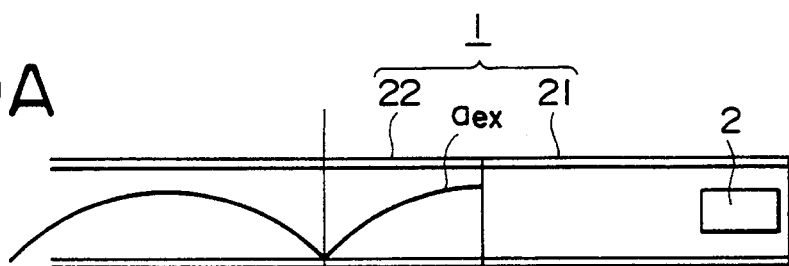
FIGS. 19A and 19B are explanatory diagrams of resonant states of a distributed-constant circuit including a distributed-constant resonator.
Figure 19B:
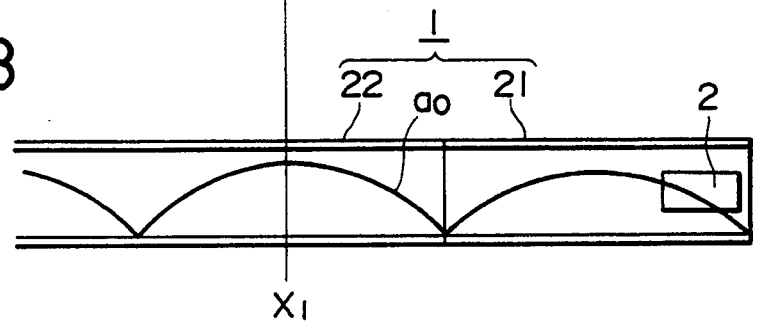

In this case, a change of the value Q of the resonator 21 on account of the change in the loss component of the resonator 21 due to the variation in $\mu_i$ is utilized. Supposing, for example, that the value Q is at its high level when $H_{ex}=0$ as shown by the curve 181 in FIG. 18, if the frequency from the oscillator 3 is changed to $\omega_1$ deviated from its resonant frequency $\omega_0$, a non-resonant state as shown in FIG. 19A is brought about. However, if the value Q is lowered, for example, as shown by the curve 182 in FIG. 18 due to a variation in $\mu_i$ when $H_{ex}$ becomes $H_{ex}=H$, then, resonance as shown in FIG. 19B occurs even at the exciting frequency $\omega_1$. Therefore, it becomes possible to detect the external magnetic field $H_{ex}$ by detecting for example the change in voltage at the specific point $x_1$.

Although changes of the real part $\mu_r$ and the imaginary part $\mu_i$ of the permeability $\mu$ of the magnetic member 2 were independently treated in the foregoing, it is also possible to arrange such that both the changes are produced at the same time and a synergistic voltage change is produced for example at a specific point $x_1$ to thereby improve the sensitivity further.

In the examples described above with reference to FIG. 16 etc., the magnetic member 2 can also be arranged to have the structure coupled with a magnetic yoke 12 as described for example in FIG. 14.

While, as described above, the distributed-constant circuit type magnetic field detector according to the present invention can be formed into a reproducing magnetic head for reading a record signal on a magnetic recording medium 5, such as a magnetic tape, a magnetic sheet, and a magnetic disk, the same can further be formed into a recording and reproducing magnetic head by adding it a recording head function of an electromagnetic inductive type.

Figure 20A:
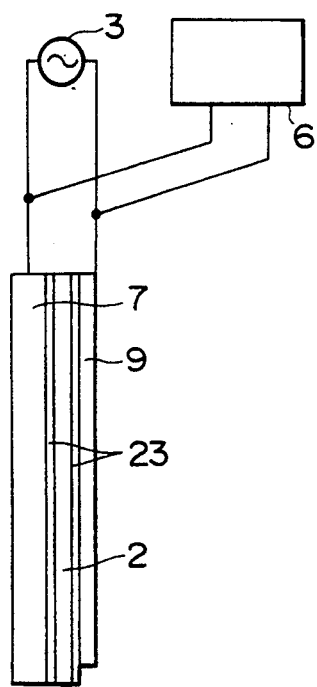
FIGS. 20A and 20B are a side view and a plan view of an example of apparatus of the invention.
Figure 20B:
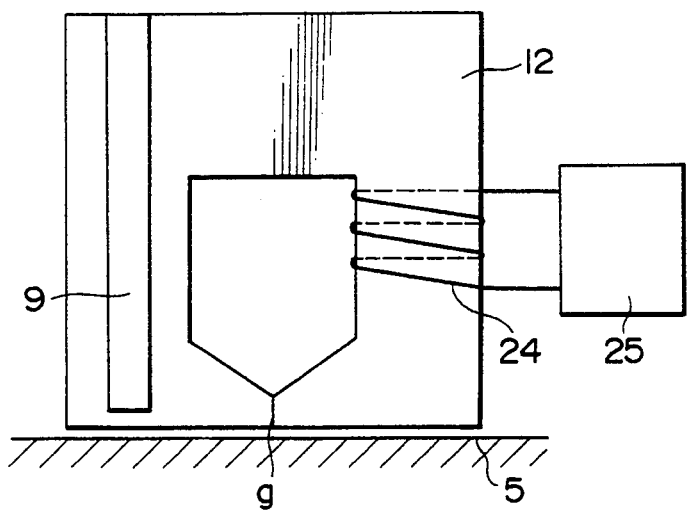

An example of adding a function of an electromagnetic inductive recording head to a reproducing head of a microstrip line type, for example, will be described with reference to a side view of FIG. 20A and a plan view of FIG. 20B. In this example, the above described magnetic member 2 of a soft magnetic material whose permeability varies with changes in the applied magnetic field is disposed on a ground conductor 7 made of Cu. Then, a magnetic yoke 12 for example of magnetic ferrite coupled with the magnetic member 2 or that using the magnetic member 2 as its constituent, or that as a whole structured of the magnetic member 2 is provided.

Figure 21:
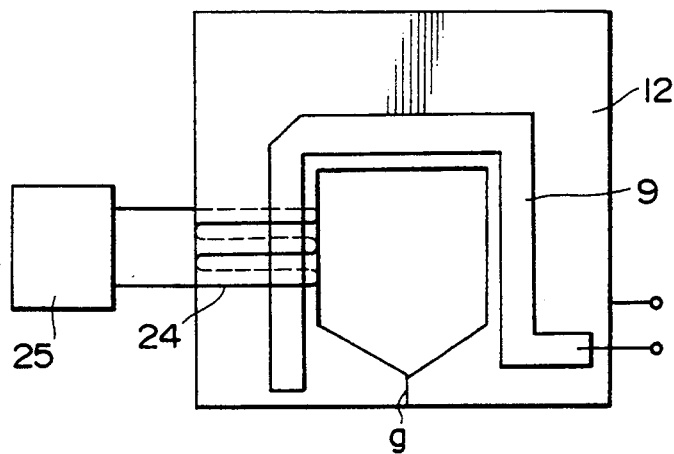
FIG. 21 is a a plan view of an example of apparatus of the invention.

The magnetic yoke 12 forms a magnetic yoke 12 (magnetic core) of a C-shaped or U-shaped thin film with a magnetic gap g provided at its end portion. On the magnetic yoke 12, there is disposed a line conductor 9 of a layer of Au, Cu, or the like shaped in a linear form as shown in the plan view of FIG. 20B or arranged in conformity with the pattern of the magnetic yoke 12 as shown in FIG. 21, such that a microstrip line is formed of the conductors 9 and 7. In this case, it is preferred that the microstrip line is short-circuited at the portion close to the gap where the magnetic field from the medium is at its maximum intensity. Further, the magnetic yoke 12 is provided with a head winding 24, i.e., an electromagnetic induction winding.

When the magnetic yoke 12 is conductive in the above described arrangement, an insulating layer 23 of $SiO_2$ or the like is interposed between the yoke 12 and each of the conductors 7 and 9.

In this arrangement, in making magnetic record on a magnetic recording medium 5, a current corresponding to a record signal from a recording signal source 25 is supplied to the head winding 24, under the condition of no high-frequency current being supplied from the oscillator 3, so that magnetic flux is generated in the magnetic yoke and the record magnetic field is produced from the magnetic gap g, and thereby, the magnetic recording is made on the magnetic recording medium 5 arranged before the same in contact or confrontation with it.

In reading the record, the waveguide line is excited by means of the oscillator 3. Under this condition, the leakage magnetic flux of record magnetization from the magnetic recording medium 5 is given to the magnetic member 2 constituting the magnetic yoke 12 or a part of it through the gap g. Then, since the state of oscillation in the waveguide line is changed by a variation in permeability of the magnetic member 2, detection of the magnetic field, hence, reading of the record on the magnetic recording medium, i.e., reproduction, can be achieved by performing for example voltage rectification or phase detection at a specific point of the waveguide line or transmission line using a detecting or measuring device 6 as described above.

Also in this case, the sensitivity can be improved by forming a portion of the microstrip line into a distributed-constant resonator or the like as described above.

Another example of the present invention applied to a recording and reproducing head will be described below. In this example, the apparatus is formed with a ring resonator as shown in a plan view and a side view of FIGS. 22A and 22B, wherein a portion of a dielectric member 85 in an ordinary ring resonator is arranged by a ring-shaped magnetic yoke 12.

In this case, a microstrip line 30 is formed of a ground conductor 7 with a large area with a line conductor 9 in a strip form provided on a portion thereof with a dielectric member 85 interposed therebetween. At another portion of the ground conductor 7, there is provided a ring-shaped thin-film magnetic yoke 12 (magnetic core) at least a portion of which is formed of a magnetic member 2 whose permeability varies with changes in the applied magnetic field and which is provided with a gap g, and, further, a line conductor 29 in a ring shape is formed thereon along the ring of the magnetic yoke 12, and thereby a ring resonator 31 is formed. If, in this case, the magnetic yoke 12 is conductive, an insulating layer 23 is interposed between the magnetic yoke 12 and each of the conductors 7 and 29. Although the conductors 9 and 29 are patterns separated from each other, they are, so to say, in capacitive coupling with each other.

The magnetic yoke 12 is provided with a head winding 24 round it.

Also in the magnetic head of the above described arrangement, in recording, a record signal current is supplied to the head winding 24 from a record signal source 25, with the microstrip line 30 and the ring-shaped resonator 31 not excited, so that magnetic flux is passed through the magnetic yoke 12 and a magnetic recording medium 5 is magnetized for making record by the magnetic field from the gap g closely confronted with the magnetic recording medium 5.

In reproduction, the ring resonator 31 is excited by the oscillator 3 through the microstrip line 30 and the permeability of the magnetic member 2 is varied according to signal magnetic flux from the record on the magnetic recording medium 5 introduced therein through the magnetic gap g, whereby the resonant characteristics of the resonator are changed. Then, for example a change in the voltage distribution depending on the change in the resonant frequency or change in Q, for example, is detected at a specific point, for example of the microstrip line or transmission line 8 as described with reference to FIG. 16 to FIG. 19.

The size of the ring resonator 31 is determined depending on whether the variation in the real part $\mu_r$ or that in the imaginary part $\mu_i$ of the permeability $\mu$ of the magnetic member 2 is utilized.

More specifically, when the variation in the real part $\mu_r$ is utilized, since the resonant wavelength itself is changed by the signal magnetic flux, in order that the resonator resonates under the condition of no magnetic flux applied thereto, the circumferential length L is set to $L=\lambda g/2$, where the resonant wavelength is $\lambda g$.

When the variation in the imaginary part $\mu_i$ is utilized, the value Q of the resonator is changed upon application of the signal magnetic flux. Hence, in the case where Q is lowered upon application of the magnetic flux, in order that no resonance takes place in the state where the value Q is high when no signal magnetic flux is applied but a resonance takes place when the value Q is lowered with a magnetic flux applied, as described with reference to FIG. 18, the circumferential length L is set to be slightly deviated from the resonant wavelength λg, i.e., $L=(λg/2)+ΔL$. In this case, instead of changing the length L, a method to set the frequency slightly shifted from the resonant frequency may be used.

Figure 23:
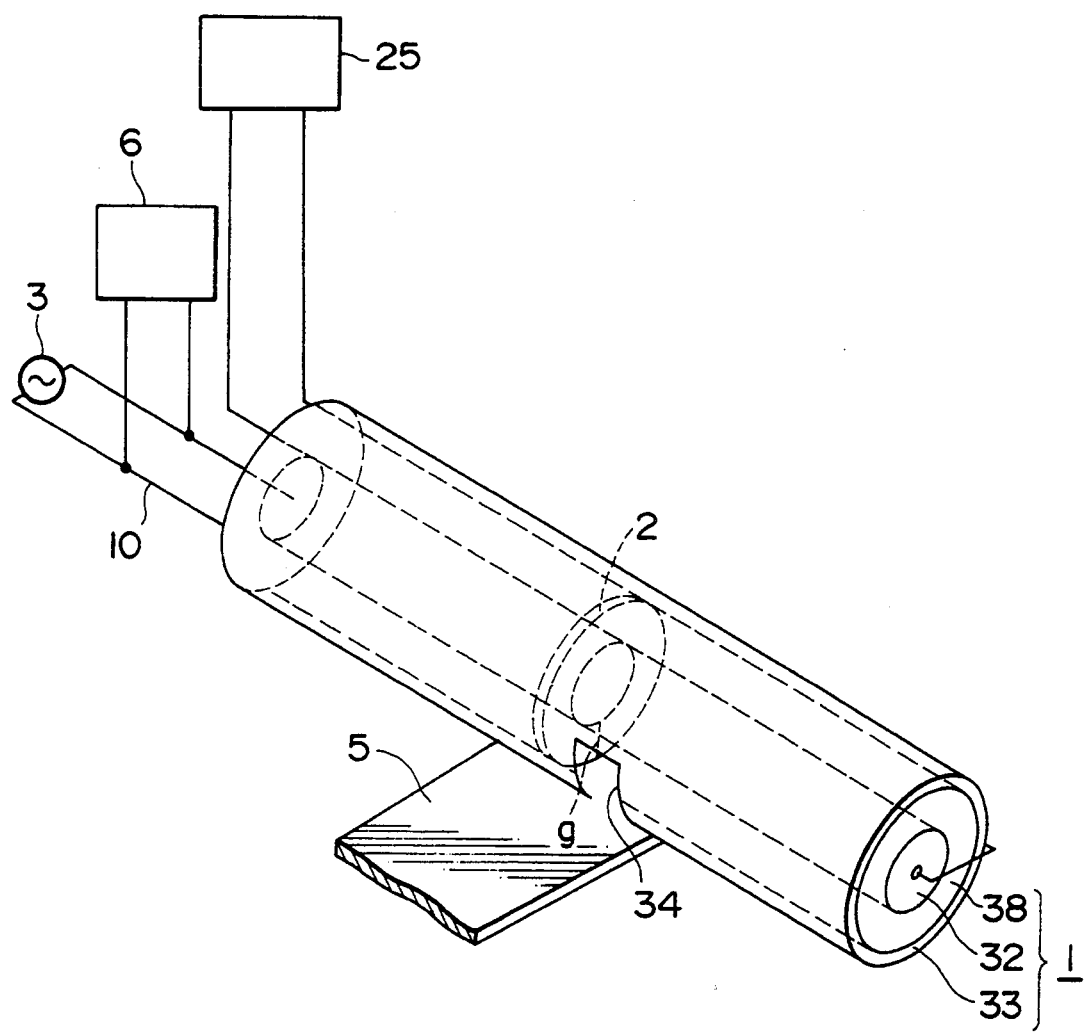
FIG. 23 is a perspective view of an example of apparatus of the invention.

In the apparatus of the present invention, a coaxial cable arrangement can also be employed. An example of such arrangement similarly applied to a recording and reproducing magnetic head is shown in FIG. 23. FIG. 23 is a schematic perspective view of the example.

In this case, a distributed-constant circuit 1 of a coaxial cable type comprises a center conductor 32, and a dielectric member 38 and a ground conductor 33 provided around the center conductor coaxially therewith. The terminal portion of the distributed-constant circuit 1 is for example short-circuited.

When the coaxial cable type distributed-constant circuit 1 is excited by an oscillator 3, there are produced an electric field in the radial direction as indicated by arrows in dotted line in FIG. 24 and a magnetic field in a circular direction as indicated by arrows in solid line. As the permeability in the circular direction is varied, the electromagnetic field distribution within the coaxial cable type distributed-constant circuit 1 changes.

Meanwhile, as the coaxial cable type distributed-constant circuit 1 with its terminal short-circuited as described above is excited by the oscillator 3, a standing wave is produced as shown in the electromagnetic field distribution along the axis in FIG. 25. The solid line in FIG. 25 indicates the electric field distribution and the dotted line indicates the magnetic field distribution. A magnetic member 2 whose permeability varies with changes in magnetic field is disposed in the position where the electric field distribution has its minimum value (namely, the position of node), i.e., the position where the magnetic field distribution has its maximum value (namely, the position of loop) as shown in FIG. 25 as well as in FIG. 23 and a transverse sectional view of the distributed-constant circuit 1 of FIG. 26.

The magnetic member 2 is made in a ring-shaped plate form disposed between the center conductor 32 and the ground conductor 33 surrounding it, with its planar direction cutting the center conductor 32 at right angle and provided with a magnetic gap g cut at a portion of it in the radial direction.

The magnetic gap g faces outward through a window made at a portion of the ground conductor 33 and is adapted to be closely confronted with a magnetic recording medium 5.

The magnetic member 2 can be formed of a ring-shaped CoTaZr plate as described above or provided by depositing a CoTaZr thin film on an insulating substrate.

When the magnetic member 2 has conductivity, an insulating layer 23 is interposed between the magnetic member 2 and each of the conductors 32 and 33 as shown in FIG. 26.

While the peripheral ground conductor 33 is provided a window 34 made therein, the size of the window 34 can be made small enough as compared with the wavelength of the electromagnetic field exciting the distributed-constant circuit 1, and therefore, the effect of the window 34 on the excitation condition is negligible.

Recording and reproducing operations of the magnetic head of the above described structure on a magnetic recording medium will now be described. In the recording, a current corresponding to the record signal at a frequency on the order for example of 10 MHz from a record signal source 25 is passed for example between the center conductor 32 and the ground conductor 33, with the distributed-constant circuit 1 not excited, so that magnetic flux is generated in the ring-shaped magnetic member 2 and a record magnetic field is generated from its magnetic gap g, and the record is made, through the window 34, on the magnetic recording medium 5 closely confronted with the gap.

In the reproduction, the recording signal source 25 is cut off from the distributed-constant circuit 1, the distributed-constant circuit 1 is excited by the oscillator 3 as described in FIG. 25, and the magnetic gap g is brought to be closely confronted with the magnetic recording medium 5. Then, a magnetic field according to magnetization of the record signal on the magnetic medium 5 is applied from the magnetic gap g to the magnetic member 2, causing its permeability to vary. Thereby, the circular electromagnetic field in the distributed-constant circuit 1 is affected and the standing wave ratio, amplitude, etc. are changed. Then, by rectifying the voltage, for example, at a specific point of the transmission line 10, as shown in FIG. 23, or of the distributed-constant circuit 1, to thereby detect or measure a change in voltage, reading of the record signal on the magnetic recording medium 5, i.e., reproduction, can be achieved.

FIG. 27 is a perspective view of another example of the distributed-constant circuit type magnetic field detector of the present invention applied to a magnetic reproducing head. In this case, a coplanar waveguide line is used as the microwave waveguide line. The apparatus in the present example comprises a coplanar waveguide line 70 being short-circuited at its terminal and having a thin film magnetic member 2 whose permeability varies with signal magnetic flux penetrating thereto, a microwave source, i.e., an oscillator 3, a rectification diode 71, and a voltmeter 63.

The rectification diode 71 is covered with an insulating material and enclosed by a grounded shielding conductor.

The coplanar waveguide line 70 is a type of microwave waveguide line and formed, as shown in FIG. 27, with a dielectric member 8 having good conductive layers of Au, Cu, or the like deposited thereon by patterning such that one layer serves as a line conductor 9 and the other layers on both sides thereof serve as ground conductors 7.

Figure 28A:
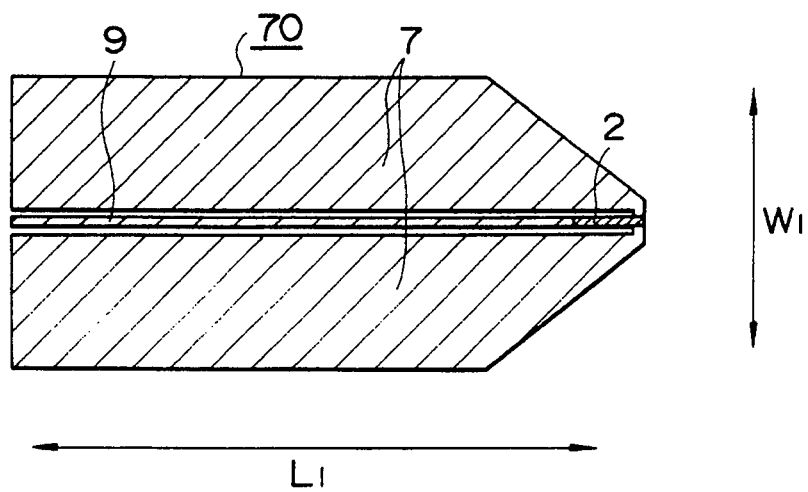
FIGS. 28A to 28C are a plan view and sectional views of a coplanar waveguide line in the apparatus of the invention shown in FIG. 27.
Figure 28B:
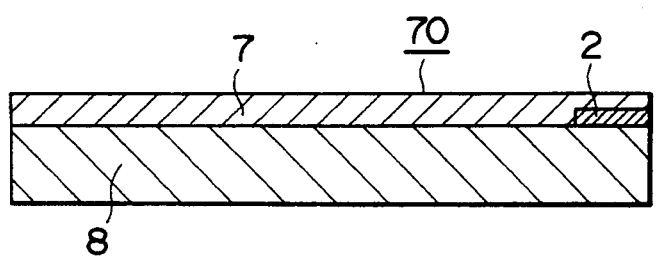
Figure 28C:
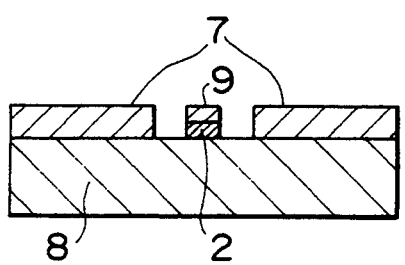

FIG. 28A is a top view of the coplanar waveguide line 70 shown in FIG. 27, and FIG. 28B and FIG. 28C are sectional views taken along broken lines b and c in FIG. 27.

In front of the terminal portion of the waveguide line 70 where the magnetic member 2 is provided, there is arranged a magnetic recording medium 5, from which a record signal is to be read out, so as to move in the direction indicated by the arrow d in sliding contact with or slightly separated from the terminal portion.

Figure 29:
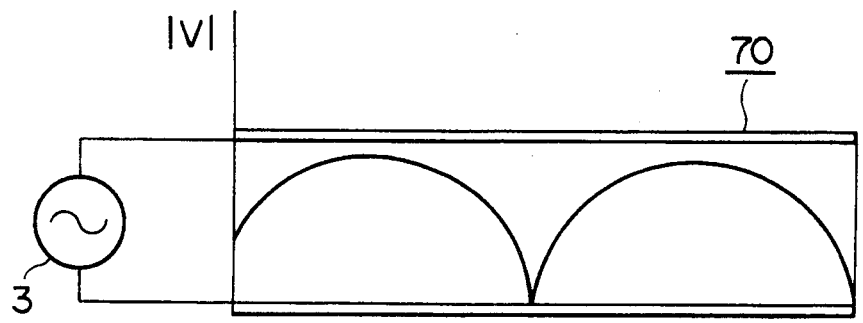
FIG. 29 is a voltage distribution diagram.

When a microwave is injected into the coplanar waveguide line 70 from the oscillator 3, the microwave is reflected by the short-circuited terminal portion and, as a result, a standing wave as shown in FIG. 29 is produced through interference between the progressive wave and the reflected wave.

At that time, denoting the lateral direction of the conductor 9 by W1 and the longitudinal direction by L1, a magnetic field of the microwave is generated in the direction W1 around the line conductor 9, and therefore, the reflection coefficient at the terminal portion is determined dependent on the permeability of the thin film magnetic member 2 in the direction W1. When the magnetic member 2 is provided with such magnetic anisotropy that the axis of easy magnetization is aligned with the direction W1, the magnetization changes its orientation from the direction W1 to the direction L1 as the signal magnetic flux is injected into the same. As a result the permeability in the direction W1 varies, and thus, the permeability can be greatly varied by a slight change in magnetic flux.

Figure 30:
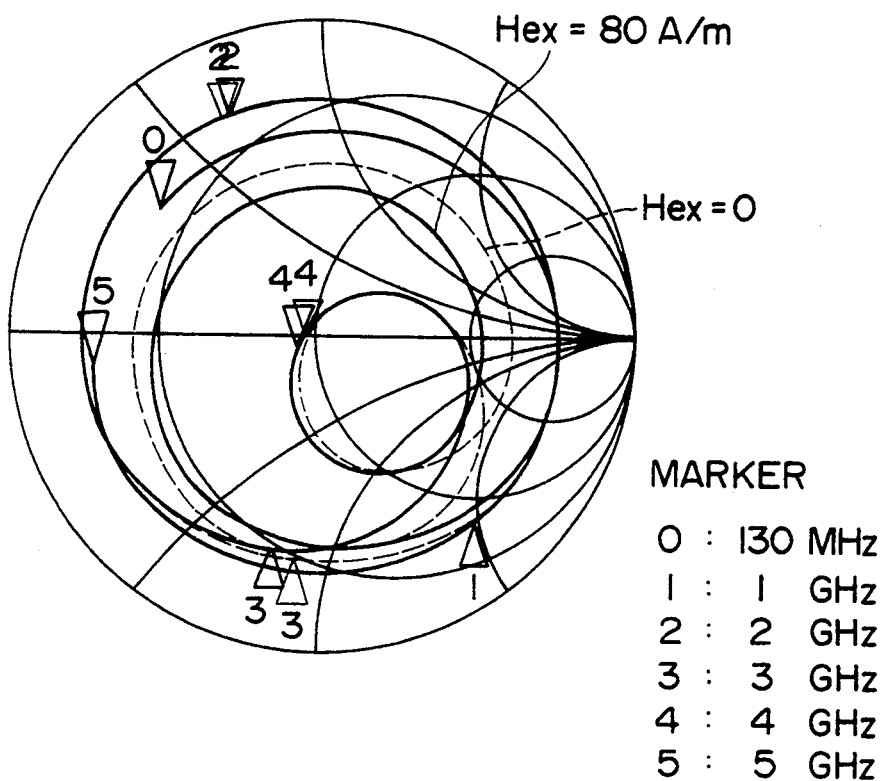
FIG. 30 is a diagram showing results of measurement of input impedance using a network analyzer.

FIG. 30 is a diagram showing results of measurement of the input impedance of the coplanar waveguide type magnetic reproducing head shown in FIG. 27 obtained by connecting the head to a network analyzer (HP8719A made by Hewlett-Packard Corp.). The range of frequencies at which the measurement was made was from 130 MHZ to 5 GHz. The broken line indicates the results when no external magnetic field is applied and the solid line indicates when an external magnetic field of 80 A/m is applied. Considerable changes in the input impedance (reflection coefficient) upon application of the external magnetic field are observed at the frequencies from 2.5 GHz to 4.5 GHz. It is generally considered that the permeability of magnetic materials sharply decreases in the high-frequency range and shows a very small value in the frequency range of several GHz. But, the results of measurement shown in FIG. 30 indicate that there is a frequency range within a high-frequency domain over 1 GHz where the permeability greatly varies under the application of external magnetic field. Hence, by utilizing the variation in the permeability in such frequency region, the operating frequencies can be set to 1–10 GHz.

Figure 31A:
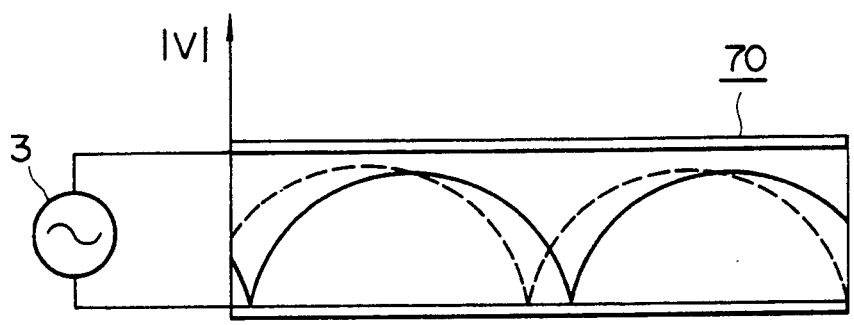
FIGS. 31a and 31B are voltage distribution diagrams.
Figure 31B:
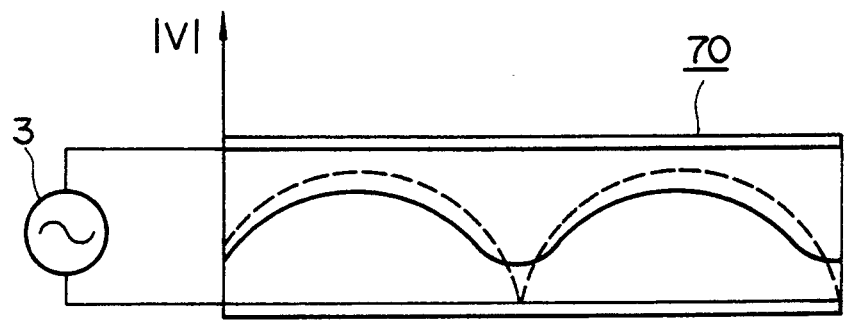

As a result of a change in the reflection coefficient at the terminal portion of the coplanar waveguide line 70, there are produced a change in the phase of the standing wave as shown in FIG. 31A and/or a change in the standing wave ratio as shown in FIG. 31B. By performing amplitude-detection of voltage by means of the diode 71 disposed in the vicinity of a node of the standing wave where the voltage amplitude of the standing wave in the coplanar waveguide line 70 shows its greatest change as shown in FIG. 27, the change in the signal flux can be detected as the greatest voltage change and the record signal can thereby be reproduced.

Figure 41:
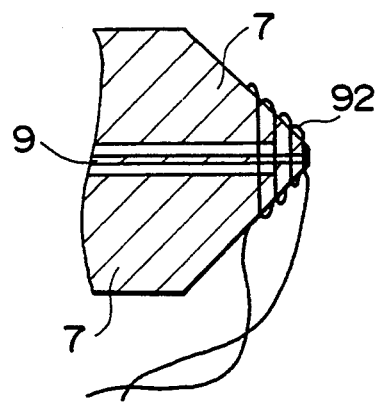
FIG. 41 is a plan view of the terminal portion of an example of reproducing magnetic head of an apparatus of the invention.

In the above described arrangement, by providing a coil 92 around the terminal portion of the coplanar waveguide line as shown in FIG. 41 and passing a current therethrough, it is achieved to apply a bias magnetic field to the magnetic member 2 shown, for example, in FIG. 28a in the direction L1, and thereby, a performance excellent in sensitivity and linearity as described earlier can be obtained.

Further, when the magnetic member 2 is provided with magnetic anisotropy having the axis of easy magnetization oriented in the direction L1, a required D.C. bias current may be applied between the line conductor 9 and the ground conductor 7. Then, by the current flow in the direction L1 through the line conductor 9 where the magnetic member 2 is disposed, a bias magnetic field perpendicular to it is applied to the magnetic member 2 in its lateral direction W1. Also by this means, a performance excellent in sensitivity and linearity can be obtained.

However, in the case where a coplanar waveguide line 70 is used for the microwave waveguide line as described above, the line of the short-circuited portion of the line conductor 9 and the ground conductor 7 at the terminal of the coplanar waveguide line 70 where the magnetic member 2 receives the strongest signal magnetic flux from the medium is divided into two directions. Hence, the magnetic field component of the microwave at this portion comes to deviate from its state uniformly aligned in the lateral direction of the line conductor 9. As a result, the change in the characteristic impedance of the waveguide line 70 exhibited when the permeability of the thin film magnetic member 2 is varied by the penetration of the signal flux becomes smaller. As the record wavelength from the medium 5 is decreased, the distance in the direction of the magnetic member 2 reachable by the signal magnetic flux becomes shorter, and when the reachable distance becomes virtually equal to the width of the short-circuiting line, the sensitivity sharply drops. Accordingly, the width of the short-circuiting line must be set below the record wavelength, but when it is made extremely narrow, electric resistance increases, lost increases, and sensitivity lowers.

Such problem can be overcome by arranging the magnetic member 2 at the short-circuiting line portion 79 of the coplanar waveguide line 70 as shown in FIG. 32. In this case, around the short-circuiting line 79 in FIG. 32, the magnetic field is generated in the lateral direction of the short-circuiting line 79, i.e., in the direction L1, and therefore, the reflection coefficient depends on the permeability in the lateral direction of the magnetic member 2. When the permeability of the magnetic thin film in the above described arrangement is varied by penetration of the signal magnetic flux from the medium, the reflection coefficient at the terminal portion changes. At this time, if the magnetic member 2 is provided with such magnetic anisotropy that its axis of easy magnetization is in the direction W1, the magnetization changes its orientation from the direction W1 to the direction L1 upon penetration of the signal magnetic flux, whereby the permeability in the direction L1 is effectively varied. Further, in this case, by passing a D.C. bias current between the ground conductors 7 having the line conductor 9 in between, i.e., through the short-circuiting line 79, to thereby apply a required bias magnetic field to the magnetic member 2 in its lateral direction (the direction perpendicular to the direction W1), the condition for obtaining excellent sensitivity and linearity as described above can be set up.

Figure 33A:
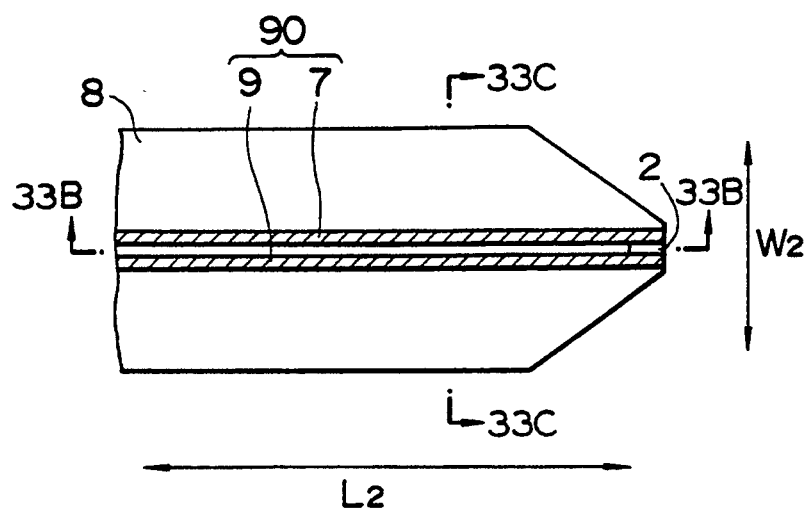
FIGS. 33A to 33C are a plan view of the main portion of a coplanar line in an example of apparatus of the invention and sectional views taken along line B—B and C—C of the same.
Figure 33B:
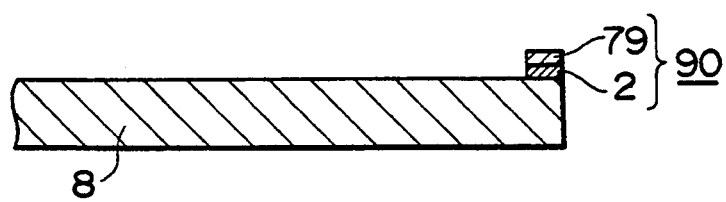
Figure 33C:
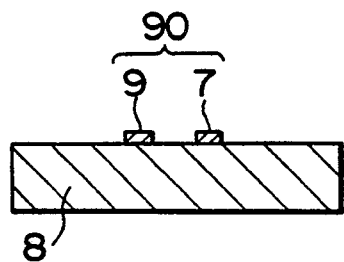

When the magnetic member 2 is disposed at the short-circuiting line portion 79 as described above, a coplanar line 90 with its terminal portion short-circuited as shown in FIG. 33 can be used as the microwave waveguide line. FIG. 33A is a plan view of the coplanar line 90, and FIG. 33B and FIG. 33C are sectional views taken along line B—B and line C—C in FIG. 33A. In this case, as shown in FIG. 33, there are provided, by patterning of good conductor, two line conductors spaced a predetermined distance apart, of which one line is serving as a ground conductor 7. Since the magnetic field is generated in the lateral direction (direction L2) of the short-circuiting line 79, the reflection coefficient depends on the permeability of the magnetic member 2 in the direction L2. If the magnetic anisotropy is provided for the magnetic member 2 such that its axis of easy magnetization is in the direction W2, the magnetization changes its orientation from the direction W2 to the direction L2 upon penetration of the signal magnetic flux, whereby the permeability in the direction L2 is varied. Further, by passing a required D.C. bias current between the line conductor 9 and the ground conductor 7, hence through the short-circuiting line 79, the magnetic member 2 can be provided with a bias magnetic field in the direction L2.

Figure 34:
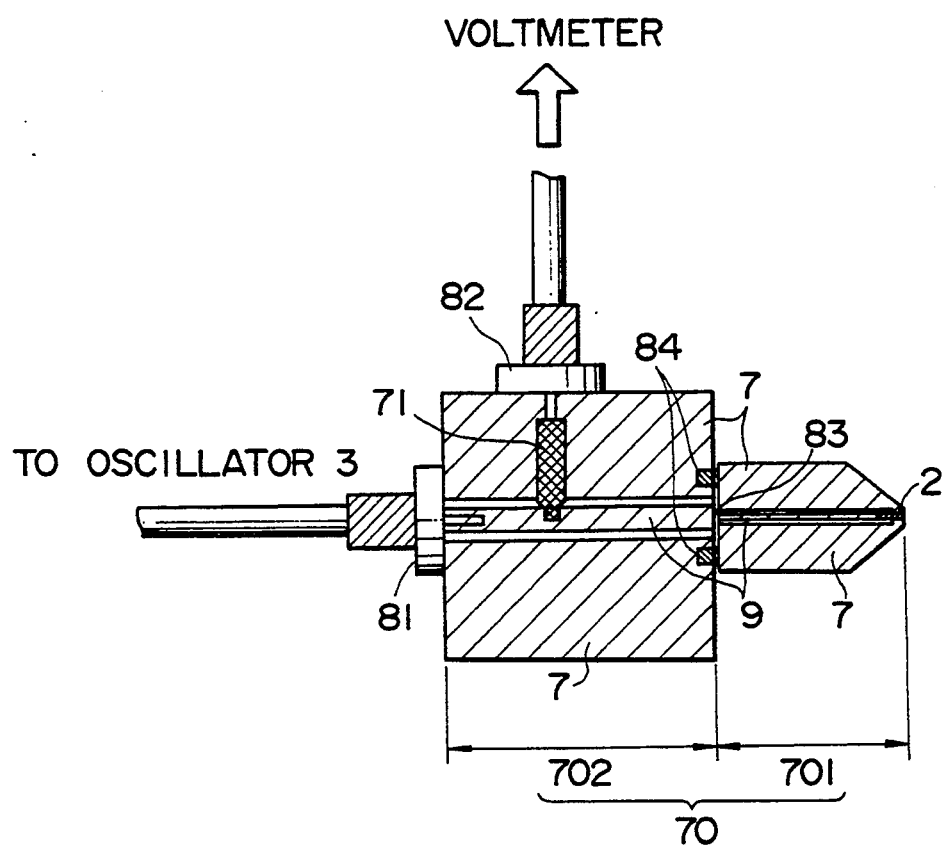
FIG. 34 is a plan view of an example of apparatus of the invention.

In actual fabrication of a coplanar microwave waveguide type magnetic reproducing head as shown for example in FIG. 27, the coplanar waveguide line 70 is fabricated by dividing it, for example, into a magneto-sensitive portion 701 and a rectification portion 702 as shown in FIG. 34.

The magneto-sensitive portion 701 was fabricated in the following way. In this case, a glass substrate was used as the dielectric member 8 shown in FIG. 27. On the substrate, an amorphous magnetic thin film of $Co_{75}Ta_{11}Zr_{14}$ was deposited to a thickness of $D1=0.5$ μm by sputtering and then the substrate was heat treated under a temperature of 300° C. and a magnetic field of $80 \times 10^3$ A/m, whereby the magnetic thin film was provided with magnetic anisotropy around $H_K=160$ A/m. Then, the same was subjected to patterning by a photo process, i.e., photolithography, into a form 30 μm wide and 100 μm long having the axis of easy magnetization aligned with the lateral direction. Then, to form a coplanar waveguide line 70 thereon, Cr was sputtered to the entire surface to a thickness of around 50 nm and then, over the same, Au was sputtered to a thickness of 1 μm. The Cr film is formed to obtain a good bond between the glass substrate as the dielectric member and Au. Then, over the same, a line conductor 9 and ground conductors 7 were formed by a photo process such that the magnetic member 2 underlies the terminal portion of the line conductor 9, as shown in an enlarged plan view of FIG. 34, and the line conductor 9 is 30 μm wide, the line conductor 9 and the ground conductor 7 are spaced a distance of 10 μm apart, the ground conductor 7 is 5 mm wide, the short-circuiting line 9 is 30 μm wide, and the waveguide line is 15 mm long. Further, a cover glass 8' (dielectric member) was bonded onto the same. At this time the input terminal portion of the coplanar waveguide line 70, which is necessary for wire bonding, was left uncovered with the cover glass 8'. The product is cut along the waveguide line pattern using a diamond cutter. Then, the glass at the terminal portion, as shown in a further enlarged view of the terminal portion of FIG. 35, was ground with a grinding film so that the front end of the magnetic thin film may smoothly contact with a magnetic recording medium when the portion is brought into contact with the magnetic recording medium in magnetic reproduction, and thus the magneto-sensitive portion 701 was fabricated.

Figure 36:
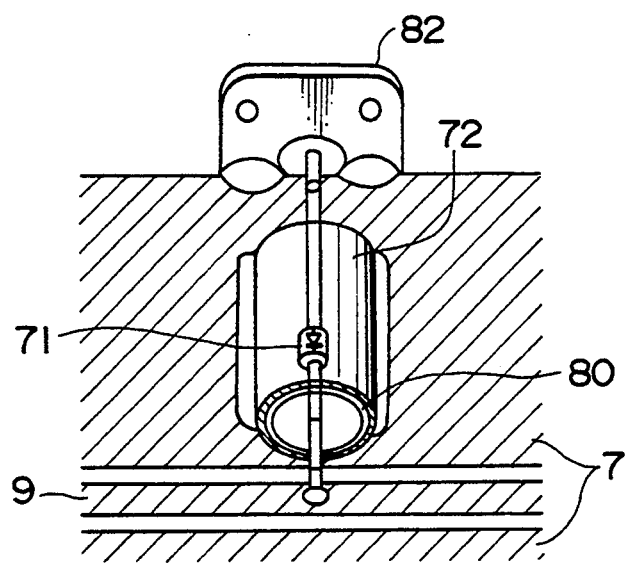
FIG. 36 is a structural drawing of a main portion of the apparatus shown in FIG. 34.

Then, in fabricating the rectification portion 702, Cr was deposited onto a glass substrate 8 to a thickness of 50 nm by sputtering, and over the same, Au was deposited to a thickness of 1 μm, and thereafter, as show in FIG. 34, a line conductor 9 with a width of 1 mm was formed, a ground conductor 7 was formed a distance of 0.33 mm apart from the line conductor 9, and the waveguide line length was set to 2.0 mm by a photo process. At this time, the ratio between the width of the line conductor 9 and the distance between the line conductor 9 and the ground conductor 7 was made equal to that in the magneto-sensitive portion 701 to obtain equal characteristic impedance. Then, the glass substrate 8 of the waveguide line was cut along the waveguide line pattern using a diamond cutter. Then, as shown in FIG. 36, one terminal of a schottky diode 71 for rectification was attached to the ground conductor 7 by conductive paste, solder, or the like. At that time, the schottky diode 71 was sheathed with a shielding conductor 72, as shown in FIG. 36, formed of an insulating layer 80 of an insulating film or the like surrounding the diode and a conductive film wound around the same, and the shielding conductor 72 was grounded. Thus, penetration of electromagnetic wave into the diode 71 is shut off and occurrence of noise is prevented.

The point at which the diode 71 is connected to the line conductor 9 depends on the frequency of the introduced microwave and selected to be in the vicinity of a node of the standing wave produced.

Further, as shown in FIG. 34, coaxial connectors 81 and 82 were attached to the product. The outer ground conductor of the coaxial connector 82 was connected with the ground conductor 7 of the coplanar waveguide line 70 and the center conductor was connected with the other terminal of the diode 71. Thus, the rectification portion 702 was fabricated.

The magneto-sensitive portion 701 and the rectification portion 702 fabricated as described above were fixed in a suitable jig and, as shown in FIG. 34, the line conductors 9 in the center of both the portions were connected by wire bonding 83 and ground conductors 7 of them on both sides were connected by a conductive material 84 such as conductive paste or solder.

Figure 37:
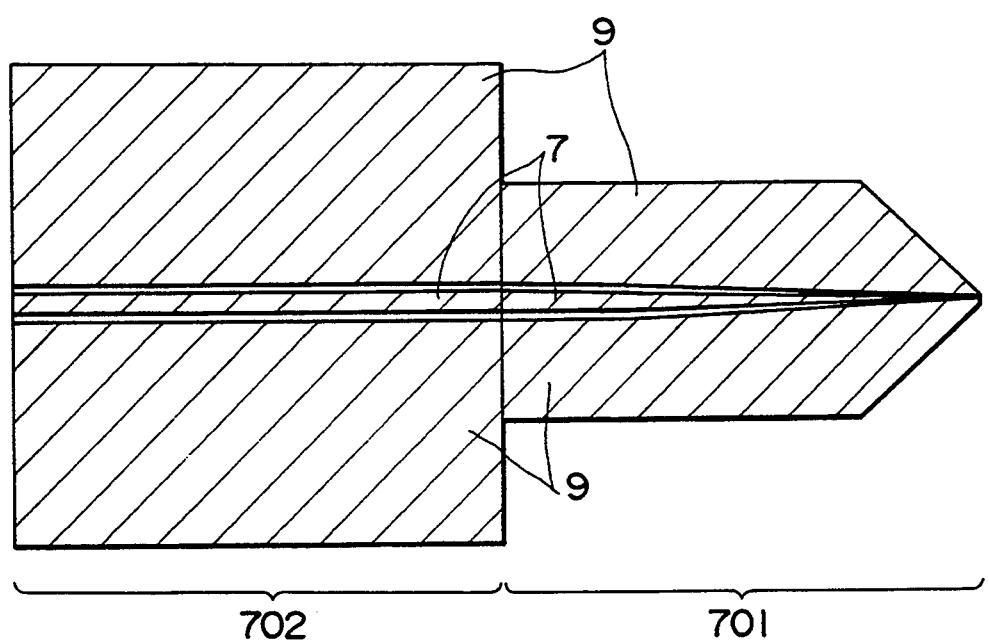
FIG. 37 is a plan view of a coplanar waveguide line of an apparatus of the invention.

Instead of connecting the magneto-sensitive portion 701 and the rectification portion 702 by wire bonding as described above, a so-called taper line as shown in FIG. 37 can be used as the coplanar waveguide line 70 of the magneto-sensitive portion 701, in which taper line, the width of the line conductor 9 and the distance between the line conductor 9 and the ground conductor 7 are made to become gradually larger until they become equal to those of the rectification portion 702, while keeping the ratio between the width of the line conductor 9 and the distance between the line conductor 9 and the ground conductor 7 constant so that the characteristic impedance is kept unchanged. By using the taper line, the loss caused by the wire bonding can be prevented.

Figure 38:
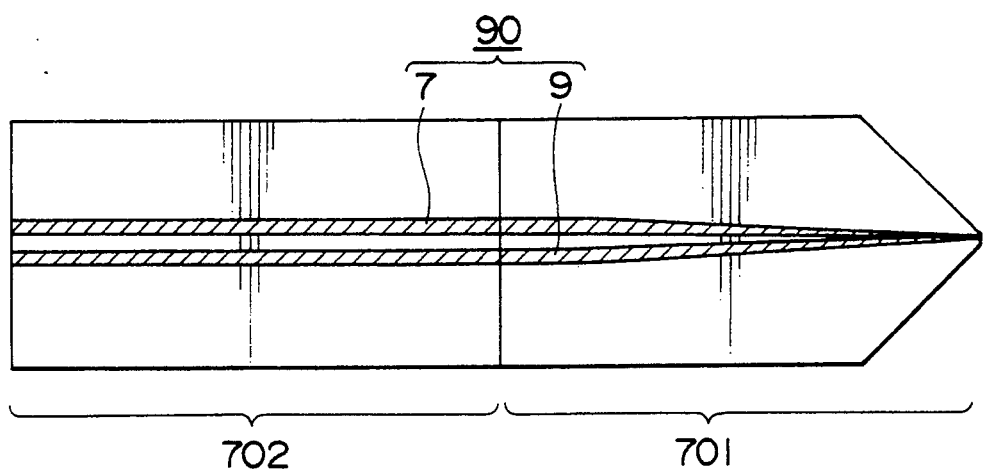
FIG. 38 is a plan view of a coplanar line of an apparatus of the invention.

The above fabricating method of the coplanar waveguide line is equally applicable to the coplanar line 90 of FIG. 38. When a taper line is used, the ratios between the widths of the line conductor 9 and the ground conductor 7 and the distance therebetween are maintained constant.

Figure 35:
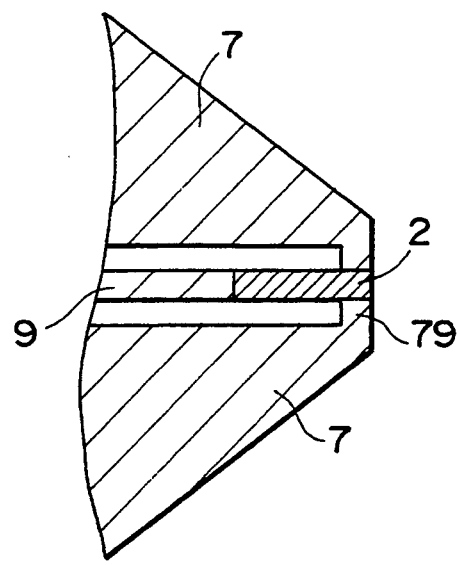
FIG. 35 is an enlarged plan view showing main portion of FIG. 34.

FIG. 30 described earlier is that showing the results of measurement of the input impedance obtained by connecting the coaxial connector 82 of the coplanar waveguide line 70 shown in FIG. 34 and FIG. 35 to the network analyzer (HP8719A made by Hewlett-Packard Corp.). Since the frequency at which the reflection coefficient, i.e., the permeability of the magnetic member 2, changes upon application of an external magnetic field $H_{ex}$ differs with the magnetic characteristic and magnetic material of the magnetic member 2, the frequency of the microwave used must be selected according to such factors.

Figure 39:
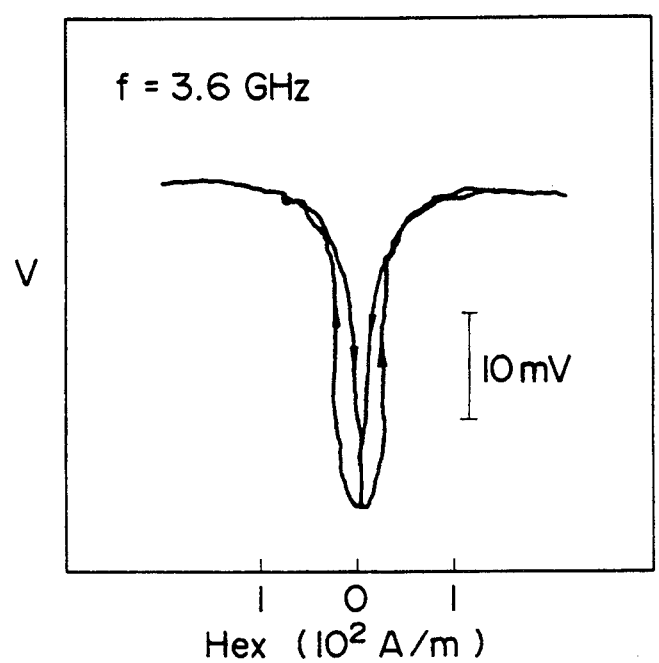
FIG. 39 is a graph showing dependency on magnetic field of the output characteristic of an example of apparatus of the invention.

FIG. 39 shows dependency on magnetic field of the output voltage at the connector 82 rectified by the rectification diode 71 in the state where an oscillator 3 of a microwave source is connected to the coaxial connector 81 of FIG. 34 and FIG. 35 through a coaxial cable and a microwave at around a frequency of 3.6 GHz is input to the waveguide line. A change in the output voltage around 30 mV was observed upon application of a magnetic field around 100 A/m.

Figure 40:
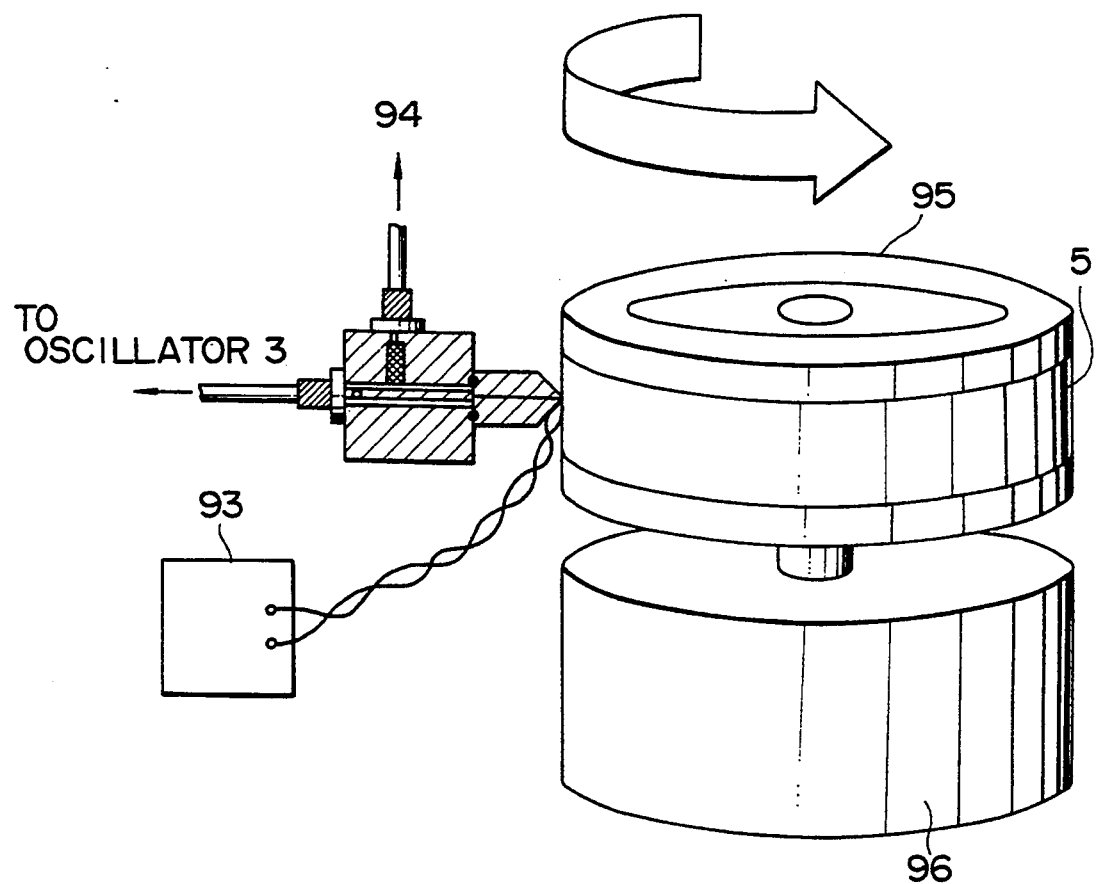
FIG. 40 is a diagram of arrangement for output characteristic measurement.
Figure 42:
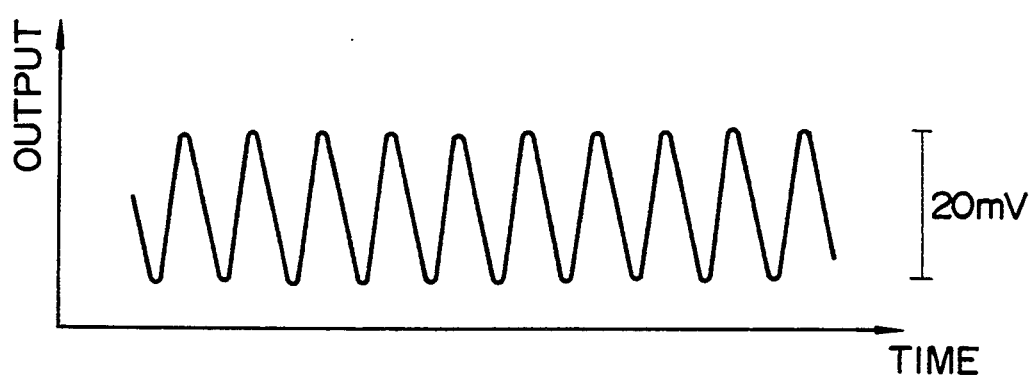
FIG. 42 is an oscillogram in output measurement.

Further, reproduction of a signal recorded on a magnetic tape, i.e., a magnetic recording medium 5, was performed according to a method shown in FIG. 40. First, a sine wave signal of 0.1 MHz was recorded on a magnetic recording medium 5 (magnetic tape) for VTR using an ordinary ring-shaped inductive magnetic head. The same as in the measurement in FIG. 39, a microwave at the frequency 3.6 GHz from an oscillator 3 is input to the waveguide line. At this time, a magnetic field ($\approx 30$ A/m), which corresponds to the point where the rate of change in the output voltage to the change in the magnetic field, dV/dH, is at its maximum in FIG. 39, is applied to the thin film magnetic member 2 at the terminal portion as a bias magnetic field. The application of the bias magnetic field is achieved by providing a coil 92 as shown in the enlarged view of the terminal portion of the reproducing head in FIG. 41 and passing a current from a bias power source 93 or by arranging a permanent magnet in the vicinity of the terminal portion. In the case where a coplanar waveguide line is used and a magnetic member is arranged as described in FIG. 32, or where a coplanar line as shown in FIG. 33 is used, the bias magnetic field can be supplied by passing D.C. current to the coplanar waveguide line or the coplanar line. In the above described state, the magnetic member 2 at the terminal of the head was arranged to be in contact with the magnetic tape for VTR and the voltage rectified by the diode 71 was detected by an oscilloscope 94. The results are shown in FIG. 42. As apparent from it, an output of 20 mV p—p, two digits or so larger than obtained by an ordinary inductive head or an MR head, was obtained. Referring to FIG. 40, reference numeral 95 denotes a guide drum of a magnetic recording medium 5, i.e., of a magnetic tape in the present example, and 96 denotes its rotational driving motor.

The magnetic field detector according to the present invention is not limited to the above illustrated examples but various changes and modifications can be made according to the purposes of use and manners of use. For example, the above described resonator type arrangement can be modified to a filter type arrangement which performs magnetic field detection by measuring the transmission coefficient of a microwave.

Further, the present invention can be applied not only to reproducing magnetic heads but also to so-called magnetic sensors for various purposes.

According to the apparatus of the present invention, a magnetic member 2 is disposed in various types of distributed-constant circuits 1 and voltage, phase, or the like is arranged to be detected at a specific point in the transmission line, distributed-constant circuit, etc. by utilizing a change in standing wave, progressive wave, or the like due to a variation in the permeability $\mu$ of the magnetic member 2 caused by a magnetic field to be detected. Therefore, detection with high sensitivity can be achieved.

The apparatus of the present invention, when applied to a reproducing magnetic head for reading a signal magnetic field from a magnetic recording medium according to recorded information, can achieve reproduction regardless of the relative speed between the head and the magnetic recording medium, the same as done by an MR magnetic head, and with higher sensitivity than that of the MR magnetic head.

Since the apparatus is arranged in a distributed-constant circuit type, i.e., in a microwave waveguide type, the carrier frequency can be increased to several hundred MHz or even to the order of GHz. Therefore, a high frequency can be used as the recording frequency on the magnetic recording medium. Because of this and that the performance is independent of the relative speed between the head and the magnetic recording medium, recording with higher packing density than before can be achieved.

More specifically, since the magnetic reproducing head of the present invention is of a type sensitive to magnetic-flux, its performance is not dependent on the relative speed between the head and the magnetic recording medium, and therefore, even if the recording density is increased, the decrease in reproduced output power is less than that with the inductive magnetic head. Further, as compared with the MR head which is also of a magnetic-flux sensitive type, since there is no need to pass a current through the magnetic member 2 directly in the head of the present invention, it is possible to input larger power thereto and, therefore, to obtain larger reproduced output power therefrom than from the MR head. Further, since high frequency magnetic field is applied to the magnetic member 2 at all times in the present invention, it can be expected that magnetic domains in the thin film are smoothly moved by the signal flux and, hence, Barkhausen noise hardly occurs and S/N ratio is improved.

Further, when compared with a magnetic reproducing head of the type making use of a change in the resonance characteristic of a coil by application of an external magnetic field, because the arrangement of the present invention utilizes the variation in the permeability of the magnetic member 2 in a still higher frequency domain (a domain of several GHz) and is adapted to be a distributed-constant circuit, it has advantages as described below:

(1) In a distributed-constant circuit, spatial distribution of the electromagnetic wave (microwave) exited therein is greatly changed with a small variation in the permeability, and hence a great voltage change can be obtained.

(2) Quantitatively accurate design with high frequency becomes possible, and it can be achieved to reduce losses such as a radiation loss and to effectively convert a variation in the permeability by a change in signal flux into a voltage change.

(3) By adopting the method to detect a change of a standing wave, not only a change in the amplitude of a microwave but also a change in the phase can be simultaneously detected as change in voltage and, hence, the sensitivity can be greatly improved.

(4) When frequency is high, wavelength becomes smaller in inverse proportion to the frequency, and hence, the phase of a microwave is greatly affected by a variation in the permeability and, accordingly, high sensitivity can be obtained.

(5) Since the carrier frequency can be increased and the signal magnetic flux from the medium is of the modulating signal of the carrier, a signal of higher frequency can be reproduced.

Thus, the present invention makes it possible to perform magnetic reproduction, i.e., magnetic field detection, with high sensitivity and excellent high-frequency characteristics, and when applied to a magnetic reproducing head, it can effectively meet the demand for higher packing density of magnetic record and higher frequency magnetic recording.

What is claimed is:

1. A magnetic reproducing head having a distributed-constant circuit type magnetic field detector comprising:

a distributed constant circuit comprising a microstrip coplanar wave guide;

a magnetic member whose permeability varies with changes in a magnetic field applied thereto disposed at a point where a magnetic field is produced in said distributed-constant circuit excited with a electromagnetic wave; and means connected to said distributed constant circuit for detecting a change in electromagnetic field distribution in said distributed-constant circuit due to a variation in permeability of said magnetic member upon application thereto of a magnetic field to be detected, whereby said magnetic field to be detected is detected.

2. The magnetic reproducing head according to claim 1, wherein a terminal of said distributed-constant circuit is set in an unmatched state so that a standing wave is produced, and the voltage of said standing wave on account of a change in said magnetic field to be detected is amplitude-detected at a point where the voltage of said standing wave is virtually at its minimum value under the condition of no magnetic field to be detected being applied, whereby said magnetic field to be detected is detected or measured.

3. The magnetic reproducing head according to claim 1, wherein at least a portion of said distributed-constant circuit is formed with a distributed-constant resonator, and said magnetic member is disposed at a point where a magnetic field is produced within said distributed-constant resonator and a change in resonance characteristic of said resonator due to a variation in permeability of said magnetic member caused by the magnetic field to be detected is detected, whereby said magnetic field to be detected is detected or measured.

4. The magnetic reproducing head according to claim 1, wherein the magnetic member whose permeability varies with changes in a magnetic field applied thereto is provided with a magnetic yoke through which the magnetic field to be detected is introduced so that a magnetic circuit including said magnetic member is formed.

5. The magnetic reproducing head according to claim 1, wherein the magnetic member whose permeability varies upon application thereto of an external magnetic field is disposed in the vicinity of a terminal portion of said distributing constant circuit.

6. A magnetic reproducing head having a distributed-constant circuit type magnetic field detector comprising:

a magnetic member, permeability of which is caused to vary by a magnetic field to be detected, disposed at the terminal portion of a microstrip coplanar waveguide line; and means connected to said line for detecting a change in the reflection coefficient at the terminal portion due to a variation in the permeability.

7. A magnetic reproducing head having a distributed-constant circuit type magnetic field detector comprising:

a magnetic member, permeability of which is caused to vary by a magnetic field to be detected, disposed at the terminal portion of a microstrip coplanar line; and means connected to said line for detecting a change in the reflection coefficient at the terminal portion due to a variation in the permeability.

8. The magnetic reproducing head according to claim 6 or 7, wherein the variation in permeability of said magnetic member at a frequency within the range from 1 GHz to 10 GHz is utilized.

9. The magnetic reproducing head according to claim 6 or 7, wherein said coplanar waveguide line or coplanar line has a portion in which the line width is gradually increased while the ratio between the conductor width and conductor spacing is maintained constant.

10. The magnetic reproducing head according to claim 6 or 7, wherein the top surface of said coplanar waveguide line or coplanar line is covered with a dielectric member.

11. The magnetic reproducing head according to claim 6 or 7, wherein a D.C. current is passed through said coplanar waveguide line or coplanar line so that a bias magnetic field is applied to said magnetic member.

* * * * *